(12) United States Patent
Fukutomi

(10) Patent No.: US 7,641,405 B2
(45) Date of Patent: Jan. 5, 2010

(54) SUBSTRATE PROCESSING APPARATUS WITH INTEGRATED TOP AND EDGE CLEANING UNIT

(75) Inventor: Yoshiteru Fukutomi, Kyoto (JP)

(73) Assignee: Sokudo Co., Ltd., Kyoto (JP)

( * ) Notice: Subject to any disclaimer, the term of this patent is extended or adjusted under 35 U.S.C. 154(b) by 0 days.

(21) Appl. No.: 12/031,677

(22) Filed: Feb. 14, 2008

(65) Prior Publication Data

US 2008/0198342 A1    Aug. 21, 2008

(30) Foreign Application Priority Data

Feb. 15, 2007    (JP) ............................. 2007-034200

(51) Int. Cl.
*G03D 5/00*    (2006.01)
*G03B 27/32*    (2006.01)

(52) U.S. Cl. .......................... 396/611; 355/27; 134/902

(58) Field of Classification Search ................. 396/611; 355/27; 134/902
See application file for complete search history.

(56) References Cited

U.S. PATENT DOCUMENTS

| 6,874,515 | B2 | 4/2005 | Ishihara et al. |
| 6,893,171 | B2 | 5/2005 | Fukutomi et al. |
| 2006/0039431 | A1 | 2/2006 | Sekiguchi et al. |
| 2006/0045722 | A1 | 3/2006 | Hashimoto |
| 2006/0108665 | A1 | 5/2006 | Kurokawa et al. |
| 2006/0147202 | A1 | 7/2006 | Yasuda et al. |
| 2006/0291855 | A1 | 12/2006 | Shigemori et al. |
| 2007/0177869 | A1 | 8/2007 | Yamamoto et al. |
| 2007/0190437 | A1 | 8/2007 | Kaneyama |

FOREIGN PATENT DOCUMENTS

| JP | 2000-223460 | 8/2000 |
| JP | 2003-324139 | 11/2003 |
| JP | 2005-294520 | 10/2005 |
| JP | 2006-012880 | 1/2006 |
| JP | 2006-032691 | 2/2006 |
| JP | 2006-80403 | * 3/2006 |
| JP | 2006-80404 | * 3/2006 |

(Continued)

OTHER PUBLICATIONS

English Translation of JP 2006-080403 (dated Mar. 23, 2006).*

(Continued)

*Primary Examiner*—Alan A Mathews
(74) *Attorney, Agent, or Firm*—Townsend and Townsend and Crew LLP

(57) ABSTRACT

A substrate processing apparatus arranged adjacent to an exposure device includes a processing section that subjects a substrate to processing and an interface provided adjacent to one end of the processing section configured to transfer and receive the substrate between the processing section and the exposure device. The processing section includes a photosensitive film formation unit configured to form a photosensitive film composed of a photosensitive material on the substrate that has not been subjected to exposure processing by the exposure device, a top surface and edge cleaning unit configured to clean a top surface and an edge of the substrate, and a development unit configured to subject the substrate to development processing after the exposure processing by the exposure device.

10 Claims, 25 Drawing Sheets

FOREIGN PATENT DOCUMENTS

| | | |
|---|---|---|
| JP | 2006-147911 | 6/2006 |
| JP | 2007-214365 | 8/2007 |
| JP | 2007-235089 | 9/2007 |
| KR | 2006-0063684 | 6/2006 |
| WO | WO 99/49504 | 9/1999 |
| WO | WO 2006/027900 | 3/2006 |
| WO | WO 2006/028173 | 3/2006 |

OTHER PUBLICATIONS

English Translation of JP 2006-080404 (dated Mar. 23, 2006).*
Office Action of Korean Patent Application No. 10-2008-0013076, dated Aug. 21, 2009, 4 pages total.

* cited by examiner

SUBSTRATE PROCESSING APPARATUS WITH INTEGRATED TOP AND EDGE CLEANING UNIT

CROSS-REFERENCES TO RELATED APPLICATIONS

This application claims priority to Japanese Patent Application 2007-034200, filed Feb. 15, 2007. The disclosure of JP 2007-034200 is hereby incorporated by reference in its entirety for all purposes.

BACKGROUND OF THE INVENTION

The present invention relates to a substrate processing apparatus that subjects substrates to processing. Substrate processing apparatuses are used to subject various types of substrates such as semiconductor substrates, substrates for liquid crystal displays, plasma displays, optical disks, magnetic disks, magneto-optical disks, and photomasks, and other substrates to various types of processing.

Such a substrate processing apparatus generally subjects a single substrate to a plurality of different types of processing successively (see, for example, JP 2003-3234139). The substrate processing apparatus as described in JP 2003-324139 A includes an indexer block, an anti-reflection film processing block, a resist film processing block, a development processing block, and an interface block. An exposure device is arranged adjacent to the interface block as an external device separate from the substrate processing apparatus.

In the above-mentioned substrate processing apparatus, a substrate carried out of the indexer block is transported to the exposure device through the interface block after being subjected to anti-reflection film formation and resist film coating processing in the anti-reflection film processing block and the resist film processing block. After a resist film on the substrate is subjected to exposure processing in the exposure device, the substrate is transported to the development processing block through the interface block. After the resist film on the substrate is subjected to development processing to form a resist pattern thereon in the development processing block, the substrate is transported to the indexer block.

With recent increases in density and integration of devices, making finer resist patterns has become an important problem. Conventional exposure devices have generally performed exposure processing by reduction-projecting reticle patterns on substrates through projection lenses. With such conventional exposure devices, however, the line widths of exposure patterns are determined by the wavelengths of light sources of the exposure devices. Therefore, making finer resist patterns have had limitations.

Therefore, a liquid immersion method is suggested as a projection exposure method allowing for finer exposure patterns (see, for example, WO99/49504 pamphlet). In a projection exposure device according to the WO99/49504 pamphlet, an area between a projection optical system and a substrate is filled with a liquid, resulting in a shorter wavelength of exposure light on a top surface of the substrate. This allows for finer exposure patterns.

In the projection exposure device according to the above-mentioned WO99/49504 pamphlet, however, exposure processing is performed with the substrate and the liquid brought into contact with each other. Therefore, a part of a component of a resist applied on the substrate is eluted in the liquid. The component of the resist eluted in the liquid contaminates a lens of the exposure device.

On the other hand, although the substrate is subjected to various types of film formation processing before the exposure processing, an edge of the substrate may, in some cases, be contaminated in the process of the film formation processing. When the substrate is subjected to the exposure processing with the edge of the substrate thus contaminated, the lens of the exposure device may be contaminated, resulting in a defective dimension and a defective shape of an exposure pattern.

SUMMARY OF THE INVENTION

An object of the present invention is to provide a substrate processing apparatus in which contamination in an exposure device is sufficiently prevented with throughput in substrate processing inhibited from being reduced and that can be miniaturized.

According to an aspect of the present invention, a substrate processing apparatus that is arranged adjacent to an exposure device includes a processing section that subjects a substrate to processing, and an interface provided adjacent to one end of the processing section for transferring and receiving the substrate between the processing section and the exposure device. The processing section includes a photosensitive film formation unit that forms a photosensitive film composed of a photosensitive material on the substrate that has not been subjected to exposure processing by the exposure device, a top surface and edge cleaning unit that cleans a top surface and an edge of the substrate, and a development unit that subjects the substrate after the exposure processing by the exposure device to development processing.

In the substrate processing apparatus, the processing section subjects the substrate to the processing. The substrate that has been subjected to the processing is transferred to the interface. The interface carries the substrate that has been transferred from the processing section into the exposure device. Thus, the exposure device subjects the substrate to the exposure processing. The substrate that has been subjected to the exposure processing is carried out of the exposure device, and is transferred to the interface. The substrate that has been transferred from the exposure device is carried into the processing section.

Here, in the processing section, the photosensitive film is formed on the substrate before the exposure processing by the exposure device, and the substrate after the exposure processing by the exposure device is subjected to the development processing.

In the processing section, the top surface and edge cleaning unit cleans the top surface and the edge of the substrate. Therefore, the top surface and the edge of the substrate before the exposure processing by the exposure device are cleaned, which can prevent contamination in the exposure device due to contamination on the top surface and the edge of the substrate before the exposure processing and can prevent a defective dimension and a defective shape of an exposure pattern. Furthermore, the necessity of individually cleaning the top surface and the edge of the substrate is eliminated in some embodiments, which inhibits throughput in substrate processing from being reduced.

Furthermore, the surface cleaning processing unit that cleans the top surface of the substrate and the edge cleaning processing unit that cleans the edge of the substrate need not be individually provided. This allows the substrate processing apparatus to be miniaturized.

The top surface and edge cleaning unit may clean the top surface and the edge of the substrate after the formation of the photosensitive film by the photosensitive film formation unit and before the exposure processing by the exposure device. In this case, the top surface and the edge of the substrate carried into the exposure device are previously cleaned, which can reliably prevent contamination in the exposure device and can prevent a defective dimension and a defective shape of an exposure pattern.

Furthermore, a component of a photosensitive material can be previously eluted by cleaning the substrate on which the photosensitive film has been formed. This allows the exposure processing to be accurately performed by means of a liquid immersion method in the exposure device.

In an embodiment, the top surface and edge cleaning unit may simultaneously clean the top surface and the edge of the substrate. In this case, the top surface and the edge of the substrate are simultaneously cleaned, which allows throughput in substrate processing can be sufficiently improved.

The processing section may further include an anti-reflection film formation unit that forms an anti-reflection film on the substrate before the formation of the photosensitive film by the photosensitive film formation unit. In this case, the anti-reflection film is formed on the substrate on which the photosensitive film has not been formed. This allows standing waves and halation generated during the exposure processing to be reduced.

The processing section may further include a protective film formation unit that forms a protective film for protecting the photosensitive film after the formation of the photosensitive film by the photosensitive film formation unit and before the exposure processing by the exposure device. In this case, the protective film is formed on the substrate before the exposure processing on which the photosensitive film has been formed. Thus, a component of the photosensitive film is prevented from being eluted in a liquid even if the exposure device performs the exposure processing with the substrate and the liquid brought into contact with each other. This can prevent contamination in the exposure device to be reliably prevented, which can sufficiently prevent processing defects in the substrate.

The processing section may include a protective film removal unit that removes the protective film after the exposure processing by the exposure device and before the development processing by the development unit. In this case, the protective film is removed from the substrate after the exposure processing and before the development processing. This causes the development processing to be reliably performed by the development unit.

The processing section may further include a reversing unit that reverses one surface and the other surface of the substrate and a back surface cleaning unit that cleans a back surface of the substrate reversed by the reversing unit. In this case, the reversing unit in the processing section can reverse the one surface and the other surface of the substrate before the exposure processing such that the back surface of the substrate whose top surface is directed upward is directed upward. The back surface cleaning unit can clean the reversed back surface of the substrate. This prevents contamination in the exposure device due to a contaminant that adheres to the back surface of the substrate. Therefore, the substrate can be subjected to the exposure processing with high accuracy, which can sufficiently prevent processing defects in the substrate.

The processing section may include a first processing unit including the photosensitive film formation unit and a first transport unit that transports the substrate, a second processing unit including the top surface and edge cleaning unit and a second transport unit that transports the substrate, and a third processing unit including the development unit and a third transport unit that transports the substrate, and the second processing unit may be arranged adjacent to the interface.

In this case, in the first processing unit, the photosensitive film formation unit forms the photosensitive film on the substrate, and the first transport unit transports the substrate before or after the formation of the photosensitive film. Furthermore, in the second processing unit, the top surface and edge cleaning unit cleans the top surface and the edge of the substrate, and the second transport unit transports the substrate before or after the cleaning. Here, the substrate transported by the second transport unit is transferred to the interface adjacent to the processing section.

Thus, the substrate the top surface and the edge of which have been cleaned is quickly carried into the exposure device through the interface, which prevents the substrate after the cleaning processing from being contaminated again. Therefore, contamination in the exposure device can be reliably prevented.

The substrate after the exposure processing is carried into the processing section through the interface, and is transported by the second transport unit in the second processing unit.

In the third processing unit, the development unit subjects the substrate to the development processing, and the third transport unit transports the substrate before or after the development processing.

The interface may include a cleaning/drying unit that cleans and dries the substrate after the exposure processing by the exposure device and an interface unit that transports the substrate. In this case, in the interface, the interface unit transports the substrate. Furthermore, the cleaning/drying unit subjects the substrate before the exposure processing to the cleaning processing. Even if dirt in an atmosphere adheres, after the exposure processing, to the substrate to which a liquid has adhered during the exposure processing, therefore, the attachment can removed.

Furthermore, the cleaning/drying unit subjects the substrate after the exposure processing to the drying processing, which can prevent the dirt in the atmosphere from adhering to the substrate after the exposure processing. Additionally, the liquid that has adhered to the substrate during the exposure processing is prevented from dropping in the processing section, which can prevent operational troubles such as abnormalities in an electric system of the substrate processing apparatus. These results can sufficiently prevent processing defects in the substrate.

In another embodiment of the present invention, a substrate processing apparatus includes an indexer block, an anti-reflection film processing block, a resist film processing block, a resist cover film processing block, a development processing block, a resist cover film removal block, a cleaning/drying processing block, and an interface block. The blocks are provided side by side in the foregoing order. An exposure device is arranged adjacent to the interface block. The exposure device subjects a substrate to exposure processing by means of a liquid immersion method. The cleaning/drying processing block has a cleaning/drying processing group. The cleaning/drying processing group is provided with a top surface and edge cleaning/drying unit that cleans a top surface and an edge of the substrate.

Other features, aspects, elements, characteristics, and advantages of the present invention will become more apparent from the following detailed description of preferred embodiments of the present invention when taken in conjunction with the accompanying reference to the attached drawings.

DETAILED DESCRIPTION OF SPECIFIC EMBODIMENTS

A substrate processing apparatus according to an embodiment of the present invention will be described with reference to the drawings. In the following description, a substrate refers to a semiconductor substrate, a substrate for a liquid crystal display, a substrate for a plasma display, a glass substrate for a photomask, a substrate for an optical disk, a substrate for a magnetic disk, a substrate for a magneto-optical disk, a substrate for a photomask, or the like.

In the following description, a surface, on which various patterns such as a circuit pattern are formed, of the substrate is referred to as a top surface, and a surface on the opposite side thereto is referred to as a back surface. Furthermore, a surface, directed downward, of the substrate is referred to as a lower surface, and a surface, directed upward, of the substrate is referred to as an upper surface.

Furthermore, the following drawings are accompanied by arrows that respectively indicate X, Y, and Z directions perpendicular to one another for clarity of a positional relationship. The X and Y directions are perpendicular to each other within a horizontal plane, and the Z direction corresponds to a vertical direction. In each of the directions, the direction of the arrow is defined as a + (positive) direction, and the opposite direction is defined as a − (negative) direction. A rotation direction centered around the Z direction is defined as a θ direction.

<1> First Embodiment

A substrate processing apparatus according to a first embodiment of the present invention will be now described with reference to the drawings.

(1) Configuration of Substrate Processing Apparatus

Figure 1:
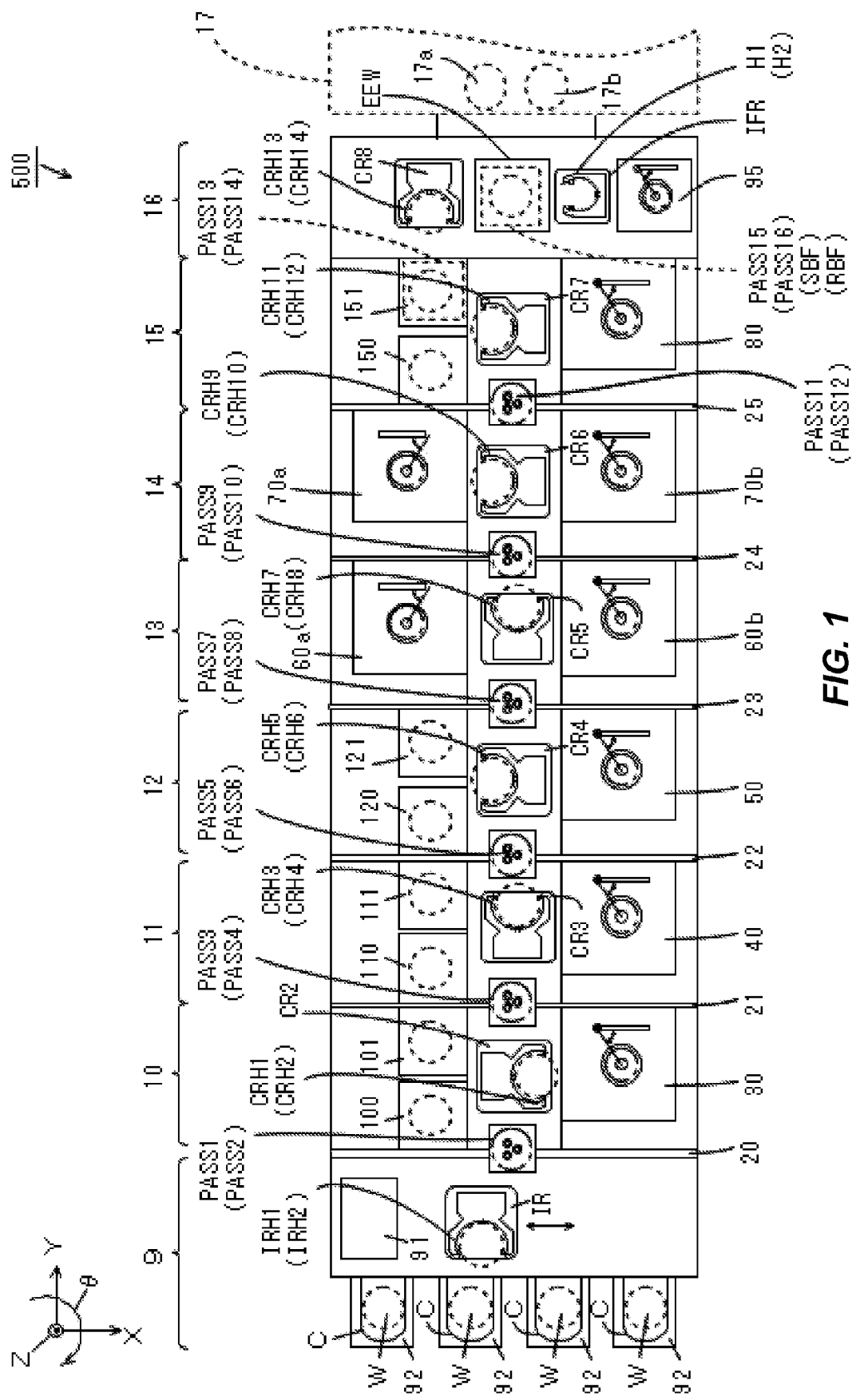
FIG. 1 is a plan view of a substrate processing apparatus according to a first embodiment.

FIG. 1 is a plan view of a substrate processing apparatus 500 according to the first embodiment. As shown in FIG. 1, the substrate processing apparatus 500 includes an indexer block 9, an anti-reflection film processing block 10, a resist film processing block 11, a resist cover film processing block 12, a development processing block 13, a resist cover film removal block 14, a cleaning/drying processing block 15, and an interface block 16. In the substrate processing apparatus 500, the blocks are provided side by side in the foregoing order.

An exposure device 17 is arranged adjacent to the interface block 16 in the substrate processing apparatus 500. The exposure device 17 subjects a substrate W to exposure processing by means of a liquid immersion method.

The indexer block 9 includes a main controller (controller) 91 for controlling the operation of each of the blocks, a plurality of carrier platforms 92, and an indexer robot IR. The indexer robot IR has hands IRH1 and IRH2 provided one above the other for receiving and transferring the substrates W.

The anti-reflection film processing block 10 includes thermal processing groups 100 and 101 for anti-reflection film, a coating processing group 30 for anti-reflection film, and a second central robot CR2. The coating processing group 30 is provided opposite to the thermal processing groups 100 and 101 with the second central robot CR2 interposed therebetween. The second central robot CR2 has hands CRH1 and CRH2 provided one above the other for receiving and transferring the substrates W.

A partition wall 20 is provided between the indexer block 9 and the anti-reflection film processing block 10 for shielding an atmosphere. The partition wall 20 has substrate platforms PASS1 and PASS2 provided in close proximity one above the other for receiving and transferring the substrates W between the indexer block 9 and the anti-reflection film processing block 10. The upper substrate platform PASS1 is used in transporting the substrates W from the indexer block 9 to the anti-reflection film processing block 10, and the lower substrate platform PASS2 is used in transporting the substrates W from the anti-reflection film processing block 10 to the indexer block 9.

Each of the substrate platforms PASS1 and PASS2 is provided with an optical sensor (not shown) for detecting the presence or absence of the substrate W. This allows determination to be made whether or not the substrate W is placed on the substrate platform PASS1 or PASS2. In addition, each of the substrate platforms PASS1 and PASS2 has a plurality of support pins secured thereto. Note that each of substrate platforms PASS3 to PASS16 described later is similarly provided with an optical sensor and support pins.

The resist film processing block 11 includes thermal processing groups 110 and 111 for resist film, a coating processing group 40 for resist film, and a third central robot CR3. The coating processing group 40 is provided opposite to the thermal processing groups 110 and 111 with the third central robot CR3 interposed therebetween. The third central robot CR3 has hands CRH3 and CRH4 provided one above the other for receiving and transferring the substrates W.

A partition wall 21 is provided between the anti-reflection film processing block 10 and the resist film processing block 11 for shielding an atmosphere. The partition wall 21 has substrate platforms PASS3 and PASS4 provided in close proximity one above the other for receiving and transferring the substrates W between the anti-reflection film processing block 10 and the resist film processing block 11. The upper substrate platform PASS3 is used in transporting the substrates W from the anti-reflection film processing block 10 to the resist film processing block 11, and the lower substrate platform PASS4 is used in transporting the substrates W from the resist film processing block 11 to the anti-reflection film processing block 10.

The resist cover film processing block 12 includes thermal processing groups 120 and 121 for resist cover film, a coating processing group 50 for resist cover film, and a fourth central robot CR4. The coating processing group 50 is provided opposite to the thermal processing groups 120 and 121 with the fourth central robot CR4 interposed therebetween. The fourth central robot CR4 has hands CRH5 and CRH6 provided one above the other for receiving and transferring the substrates W.

A partition wall 22 is provided between the resist film processing block 11 and the resist cover film processing block 12 for shielding an atmosphere. The partition wall 22 has substrate platforms PASS5 and PASS6 provided in close proximity one above the other for receiving and transferring the substrates W between the resist film processing block 11 and the resist cover film processing block 12. The upper substrate platform PASS5 is used in transporting the substrates W from the resist film processing block 11 to the resist cover film processing block 12, and the lower substrate platform PASS6 is used in transporting the substrates W from the resist cover film processing block 12 to the resist film processing block 11.

The development processing block 13 includes development processing groups 60a and 60b and a fifth central robot CR5. The development processing groups 60a and 60b are provided opposite to each other with the fifth central robot CR5 interposed therebetween. The fifth central robot CR5 has hands CRH7 and CRH8 provided one above the other for receiving and transferring the substrates W.

A partition wall 23 is provided between the resist cover film processing block 12 and the development processing block 13 for shielding an atmosphere. The partition wall 23 has substrate platforms PASS7 and PASS8 provided in close proximity one above the other for receiving and transferring the substrates W between the resist cover film processing block 12 and the development processing block 13. The upper substrate platform PASS7 is used in transporting the substrates W from the resist cover film processing block 12 to the development processing block 13, and the lower substrate platform PASS8 is used in transporting the substrates W from the development processing block 13 to the resist cover film processing block 12.

The resist cover film removal block 14 includes removal processing groups 70a and 70b for resist cover film and a sixth central robot CR6. The removal processing groups 70a and 70b are provided opposite to each other with the sixth central robot CR6 interposed therebetween. The sixth central robot CR6 has hands CRH9 and CRH10 provided one above the other for receiving and transferring the substrates W.

A partition wall 24 is provided between the development processing block 13 and the resist cover film removal block 14 for shielding an atmosphere. The partition wall 24 has substrate platforms PASS9 and PASS10 provided in close proximity one above the other for receiving and transferring the substrates W between the development processing block 13 and the resist cover film removal block 14. The upper substrate platform PASS9 is used in transporting the substrates W from the development processing block 13 to the resist cover film removal block 14, and the lower substrate platform PASS10 is used in transporting the substrates W from the resist cover film removal block 14 to the development processing block 13.

The cleaning/drying processing block 15 includes thermal processing groups 150 and 151 for post-exposure bake, a cleaning/drying processing group 80, and a seventh central robot CR7. The thermal processing group 151 is adjacent to the interface block 16, and includes substrate platforms PASS13 and PASS14, as described later. The cleaning/drying processing group 80 is provided opposite to the thermal processing groups 150 and 151 with the seventh central robot CR7 interposed therebetween. The seventh central robot CR7 has hands CRH11 and CRH12 provided one above the other for receiving and transferring the substrates W.

A partition wall 25 is provided between the resist cover film removal block 14 and the cleaning/drying processing block 15 for shielding an atmosphere. The partition wall 25 has substrate platforms PASS11 and PASS12 provided in close proximity one above the other for receiving and transferring the substrates W between the resist cover film removal block 14 and the cleaning/drying processing block 15. The upper substrate platform PASS11 is used in transporting the substrates W from the resist cover film removal block 14 to the cleaning/drying processing block 15, and the lower substrate platform PASS12 is used in transporting the substrates W from the cleaning/drying processing block 15 to the resist cover film removal block 14.

In the interface block 16, an eighth center robot CR8, an edge exposure unit EEW, an interface transporting mechanism IFR, and a post-exposure cleaning/drying processing group 95 are arranged in this order along the +X direction. Substrate platforms PASS15 and PASS16, a sending buffer 16, and a return buffer RBF, described later, are provided below the edge exposure unit 95. The eighth central robot CR8 has hands CRH13 and CRH14 provided one above the other for receiving and transferring the substrates W, and the interface transporting mechanism IFR has hands H1 and H2 provided one above the other for receiving and transferring the substrates W.

Figure 2:
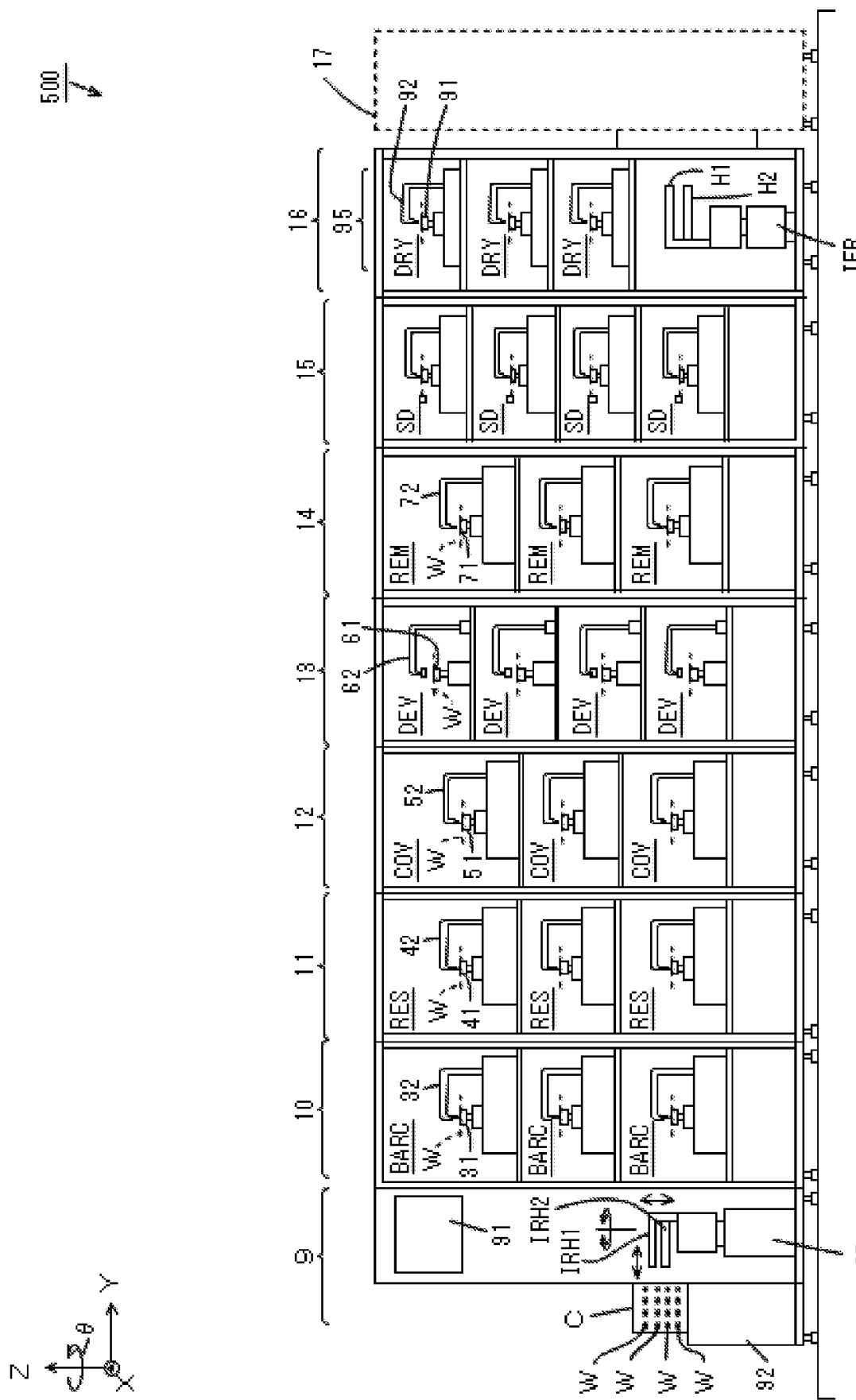
FIG. 2 is a side view on one side of the substrate processing apparatus shown in FIG. 1.

FIG. 2 is a side view on one side of the substrate processing apparatus 500 shown in FIG. 1. The coating processing group 30 (see FIG. 1) in the anti-reflection film processing block 10 has a vertical stack of three coating units BARC. Each of the coating units BARC includes a spin chuck 31 for rotating the substrate W with the substrate W held in a horizontal attitude by suction, and a supply nozzle 32 for supplying a coating liquid for an anti-reflection film to the substrate W held on the spin chuck 31.

The coating processing group 40 (see FIG. 1) in the resist film processing block 11 has a vertical stack of three coating units RES. Each of the coating units RES includes a spin chuck 41 for rotating the substrate W with the substrate W held in a horizontal attitude by suction, and a supply nozzle 42 for supplying a coating liquid for a resist film to the substrate W held on the spin chuck 41.

The coating processing group 50 (see FIG. 1) in the resist cover film processing block 12 has a vertical stack of three coating units COV. Each of the coating units COV includes a spin chuck 61 for rotating the substrate W with the substrate W held in a horizontal attitude by suction, and a supply nozzle 52 for supplying a coating liquid for a resist cover film to the substrate W held on the spin chuck 51. Materials having a low affinity for resists and water (materials having low reactivity to resists and water) can be used as the coating liquid for the resist cover film. An example of the coating liquid is fluororesin. Each of the coating units COV forms a resist cover film on the resist film formed on the substrate W by applying the coating liquid onto the substrate W while rotating the substrate W.

The development processing group 60b (see FIG. 1) in the development processing block 13 has a vertical stack of four development processing units DEV. Each of the development processing units DEV includes a spin chuck 61 for rotating the substrate W with the substrate W held in a horizontal attitude by suction, and a supply nozzle 62 for supplying a development liquid to the substrate W held on the spin chuck 51.

The removal processing group 70b (see FIG. 1) in the resist cover film removal block 14 has a vertical stack of three removal units REM. Each of the removal units REM includes a spin chuck 71 for rotating the substrate W with the substrate W held in a horizontal attitude by suction, and a supply nozzle 72 for supplying a stripping liquid (e.g. fluororesin) to the substrate W held on the spin chuck 71. Each of the removal units REM removes the resist cover film formed on the substrate W by applying the stripping liquid onto the substrate W while rotating the substrate W.

Note that a method of removing the resist cover film in the removal units REM is not limited to the above-mentioned example. For example, the resist cover film may be removed by supplying the stripping liquid onto the substrate W while moving a slit nozzle above the substrate W.

The cleaning/drying processing group 80 (see FIG. 1) in the cleaning/drying processing block 15 has a vertical stack of four top surface and edge cleaning/drying units SD. The details of the top surface and edge cleaning/drying unit SD will be described later.

The post-exposure cleaning/drying processing group 95 in the interface block 16 has a vertical stack of three post-exposure cleaning/drying units DRY. Each of the post-exposure cleaning/drying units DRY includes a spin chuck 91 for rotating the substrate W with the substrate W held in a horizontal attitude by suction, and a nozzle 92 for supplying a processing liquid for cleaning (a cleaning liquid and a rinse liquid) to the substrate W held on the spin chuck 91.

Figure 3:
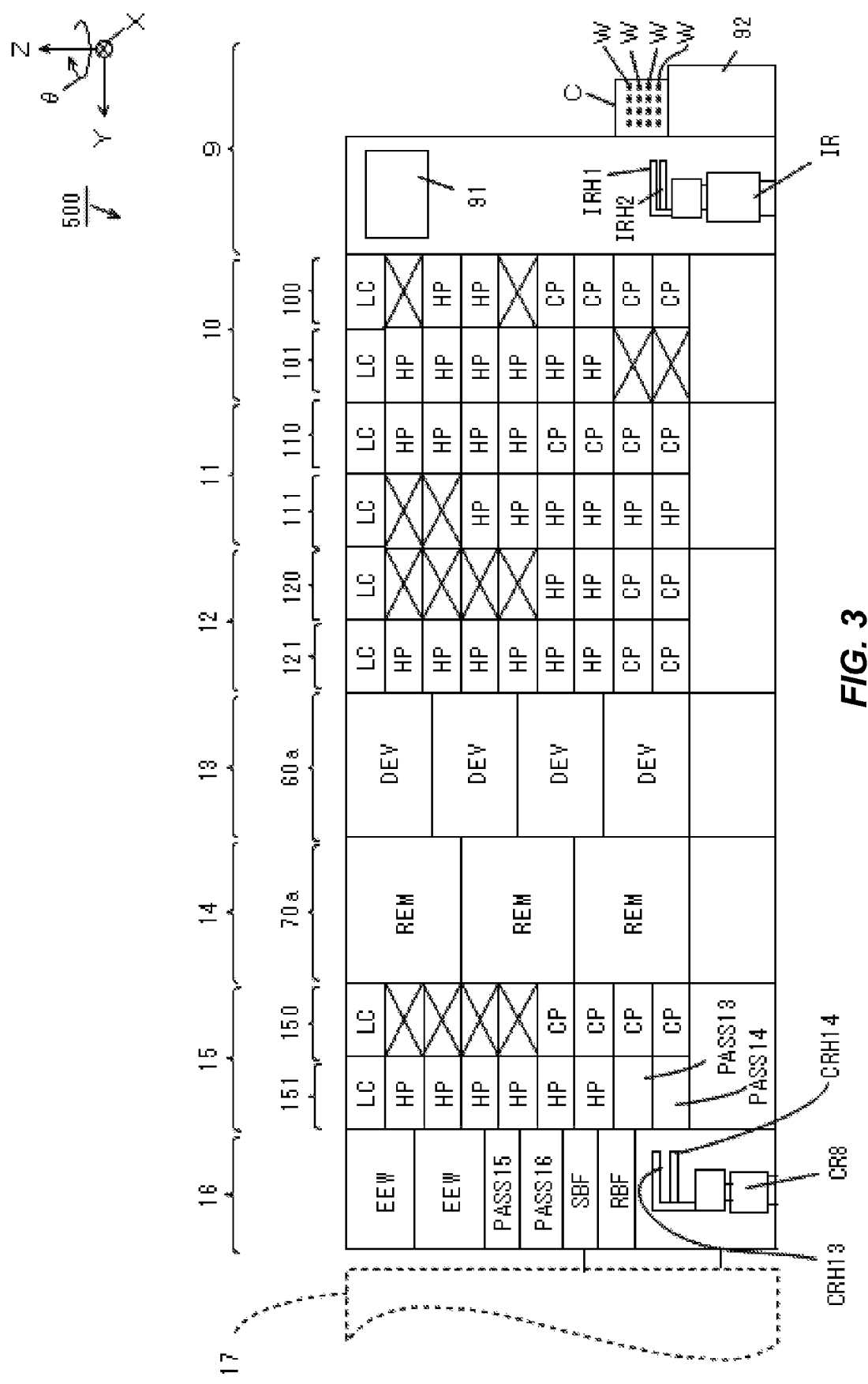
FIG. 3 is a side view on the other side of the substrate processing apparatus shown in FIG. 1.

FIG. 3 is a side view on the other side of the substrate processing apparatus 500 shown in FIG. 1. In the anti-reflection film processing block 10, the thermal processing group 100 has a vertical stack of two heating units (hot plates) HP and four cooling units (cooling plates) CP, and the thermal processing group 101 has a vertical stack of six heating units HP. Furthermore, each of the thermal processing groups 100 and 101 has a local controller LC for controlling the respective temperatures of the heating unit HP and the cooling unit CP arranged in its uppermost part.

In the resist film processing block 11, the thermal processing group 110 has a vertical stack of four heating units HP and four cooling units CP, and the thermal processing group 111 has a vertical stack of six heating units HP. Furthermore, each of the thermal processing groups 110 and 111 also has a local controller LC for controlling the respective temperatures of the heating unit HP and the cooling unit CP arranged in its uppermost part.

In the resist cover film processing block 12, the thermal processing group 120 has a vertical stack of two heating units HP and two cooling units CP, and the thermal processing group 121 has a vertical stack of six heating units HP and two cooling units CP. Furthermore, each of the thermal processing groups 120 and 121 has a local controller LC for controlling the respective temperatures of the heating unit HP and the cooling unit CP arranged in its uppermost part.

The development processing group 60a in the development processing block 13 has a vertical stack of four development processing units DEV.

The removal processing group 70a in the resist cover film removal block 14 has a vertical stack of three removal units REM.

In the cleaning/drying processing block 15, the thermal processing group 150 has a vertical stack of four cooling units CP, and the thermal processing group 151 has a vertical stack of six heating units HP and substrate platforms PASS13 and PASS14. Furthermore, each of the thermal processing groups 150 and 151 has a local controller LC for controlling the respective temperatures of the heating unit HP and the cooling unit CP arranged in its uppermost part.

The interface block 16 has a vertical stack of two edge exposure units EEW, substrate platforms PASS15 and PASS16, a sending buffer unit SBF, and a return buffer unit RBF arranged in its substantially central part (see FIG. 1). Each of the edge exposure units EEW includes a spin chuck (not shown) for rotating the substrate W with the substrate W held in a horizontal attitude by suction, and a light irradiator (not shown) for exposing a peripheral portion of the substrate W held on the spin chuck.

Note that the respective numbers of coating units BARC, RES, and COV, top surface and edge cleaning/drying units SD, removal units REM, post-exposure cleaning/drying units DRY, edge exposure units EEW, heating units HP, and cooling units CP may be changed, as needed, depending on the processing speed of each of the blocks 10 to 16.

(2) Operations of Substrate Processing Apparatus

The operations of the substrate processing apparatus 500 according to the first embodiment will be then described with reference to FIGS. 1 to 3.

Carriers C that each store a plurality of substrates W in multiple stages are respectively placed on the carrier platforms 92 in the indexer block 9. The indexer robot IR takes out the unprocessed substrate W that is stored in the carrier C using the upper hand IRH1. Thereafter, the indexer robot IR rotates in the ±θ direction while moving in the ±X direction, to place the unprocessed substrate W on the substrate platform PASS1.

Although FOUPs (Front Opening Unified Pods) are adopted as the carriers C in the present embodiment, the present invention is not limited to the same. For example, SMIF (Standard Mechanical Inter Face) pods, or OCs (Open Cassettes) that expose the stored substrates W to outside air may be used.

Furthermore, although linear-type transport robots that move their hands forward or backward by linearly sliding them to the substrate W are respectively used as the indexer robot IR, the second to eighth central robots CR2 to CR8, and the interface transporting mechanism IFR, the present invention is not limited to the same. For example, multi-joint type transport robots that linearly move their hands forward and backward by moving their joints may be used.

The substrate W placed on the substrate platform PASS1 is received by the second central robot CR2 in the anti-reflection film processing block 10. The second central robot CR2 carries the substrate W into the coating processing group 30. In the coating processing group 30, the coating unit BARC forms a coating of an anti-reflection film on the substrate W in order to reduce standing waves and halation generated during the exposure processing.

Thereafter, the second central robot CR2 then takes out the substrate W that has been subjected to the coating processing from the coating processing group 30, and carries the substrate W into the thermal processing group 100 or 101. Then, the second central robot CR2 takes out the thermally processed substrate W from the thermal processing group 100 or 101, and places the substrate W on the substrate platform PASS3.

The substrate W placed on the substrate platform PASS3 is received by the third central robot CR3 in the resist film processing block 11. The third central robot CR3 carries the substrate W into the coating processing group 40. In the coating processing group 40, the coating unit RES forms a coating of a resist film on the anti-reflection film.

Thereafter, the third central robot CR3 takes out the substrate W that has been subjected to the coating processing from the coating processing group 40, and carries the substrate W into the thermal processing group 110 or 111. Then, the third central robot CR3 takes out the thermally processed substrate W from the thermal processing group 110 or 111, and places the substrate W on the substrate platform PASS5.

The substrate W placed on the substrate platform PASS5 is received by the fourth central robot CR4 in the resist cover film processing block 12. The fourth central robot CR4 carries the substrate W into the coating processing group 50. In the coating processing group 50, the coating unit COV forms a coating of a resist cover film on the resist film.

Thereafter, the fourth central robot CR4 takes out the substrate W that has been subjected to the coating processing from the coating processing group 50, and carries the substrate W into the thermal processing group 120. Then, the fourth central robot CR4 takes out the thermally processed substrate W from the thermal processing group 120, and places the substrate W on the substrate platform PASS7.

The substrate W placed on the substrate platform PASS7 is received by the fifth central robot CR5 in the development processing block 13. The fifth central robot CR5 places the substrate W on the substrate platform PASS9.

The substrate W placed on the substrate platform PASS9 is received by the sixth central robot CR6 in the resist cover film removal block 14. The sixth central robot CR6 places the substrate W on the substrate platform PASS11.

The substrate W placed on the substrate platform PASS11 is received by the seventh central robot CR7 in the cleaning/drying processing block 15. The seventh central robot CR7 carries the substrate W into the top surface and edge cleaning/drying unit SD in the cleaning/drying processing group 80. The top surface and edge cleaning/drying processing unit SD subjects the substrate W that has been carried thereinto to top surface and edge cleaning processing, described more fully later. This causes a top surface and an edge of the substrate W before exposure processing by the exposure device 17 to be kept clean.

Then, the seventh central robot CR7 takes out the substrate W that has been subjected to the top surface and edge cleaning processing from the top surface and edge cleaning/drying unit SD, and places the substrate W on the substrate platform PASS13.

The substrate W placed on the substrate platform PASS13 is received by the eighth central robot CR8 in the interface block 16. The eighth central robot CR8 carries the substrate W into the edge exposure unit EEW. The edge exposure unit EEW subjects the peripheral portion of the substrate W to edge exposure processing. Then, the eighth central robot CR8 takes out the substrate W that has been subjected to the edge exposure processing from the edge exposure unit EEW, and places the substrate W on the substrate platform PASS15.

The substrate W placed on the substrate platform PASS15 is carried into a substrate carry-in section 17a (see FIG. 1) in the exposure device 17 by the interface transporting mechanism IFR. Note that when the exposure device 17 cannot receive the substrate W, the substrate W is temporarily stored in the sending buffer unit SBF.

After the exposure device 17 subjects the substrate W to the exposure processing, the interface transporting mechanism IFR takes out the substrate W from a substrate carry-out section 17b (see FIG. 1) in the exposure device 17, and carries the substrate W into the post-exposure cleaning/drying processing group 95.

As described in the foregoing, in the post-exposure cleaning/drying unit DRY in the post-exposure cleaning/drying processing group 95, a processing liquid (a cleaning liquid and a rinse liquid) is supplied from the nozzle 92 to the top surface of the substrate W that rotates in a horizontal attitude by the spin chuck 91 (see FIG. 2). This causes the top surface of the substrate W to be cleaned. Thereafter, the supply of the processing liquid from the nozzle 92 to the substrate W is stopped, which causes the cleaning liquid that adheres to the substrate W to be scattered while causing the top surface of the substrate W to be dried (scattering drying).

Note that the post-exposure cleaning/drying unit DRY may be provided with a gas spray nozzle that sprays inert gas on the top surface of the substrate W. In this case, the inert gas is sprayed on the substrate W from the gas spray nozzle while the substrate W is being subjected to the scattering drying or after a liquid layer of the rinse liquid is formed on the top surface of the substrate W, which causes the top surface of the substrate W to be reliably dried.

In the post-exposure cleaning/drying processing group 95, the substrate W after the exposure processing is thus subjected to the cleaning and drying processing. Thereafter, the interface transporting mechanism IFR takes out the substrate W from the post-exposure cleaning/drying processing group 95, and places the substrate W on the substrate platform PASS16. When the cleaning and drying processing cannot be temporarily performed in the post-exposure cleaning/drying processing group 95 due to a failure or the like, the substrate W after the exposure processing can be temporarily stored in the return buffer unit RBF in the interface block 16.

The substrate W placed on the substrate platform PASS16 is received by the eighth central robot CR8 in the interface block 16. The eighth central robot CR8 carries the substrate W into the thermal processing group 151 in the cleaning/drying processing block 15.

In the thermal processing group 151, the substrate W is subjected to post-exposure bake (PEB). Thereafter, the eighth central robot CR8 takes out the substrate W from the thermal processing group 151, and places the substrate W on the substrate platform PASS14. Although the thermal processing group 151 subjects the substrate W to the post-exposure bake in the present embodiment, the thermal processing group 150 may subject the substrate W to post-exposure bake.

The substrate W placed on the substrate platform PASS14 is received by the seventh central robot CR7 in the cleaning/drying processing block 15. The seventh central robot CR7 places the substrate W on the substrate platform PASS12. The substrate W placed on the substrate platform PASS12 is received by the sixth central robot CR6 in the resist cover film removal block 14. The sixth central robot CR6 carries the substrate W into the resist cover film removal processing group 70a or 70b. In the resist cover film removal processing group 70a or 70b, the removal unit REM removes the resist cover film on the substrate W.

Thereafter, the sixth central robot CR6 takes out the substrate W that has been subjected to the removal processing from the resist cover film removal processing group 70a or 70b, and places the substrate W on the substrate platform PASS10.

The substrate W placed on the substrate platform PASS10 is received by the fifth central robot CR5 in the development processing block 13. The fifth central robot CR5 carries the substrate W into the development processing group 60a or 60b. In the development processing group 60a or 60b, the development processing unit DEW subjects the substrate W to development processing. Thereafter, the fifth central robot CR5 takes out the substrate W that has been subjected to the development processing from the development processing group 60a or 60b, and places the substrate W on the substrate platform PASS8.

The substrate W placed on the substrate platform PASS8 is received by the fourth central robot CR4 in the resist cover film processing block 12. The fourth center robot CR4 carries the substrate W into the thermal processing group 121. In the thermal processing group 121, the substrate W after the development processing is subjected to thermal processing. The fourth central robot CR4 takes out the thermally processed substrate W from the thermal processing group 121, and places the substrate W on the substrate platform PASS6.

The substrate W placed on the substrate platform PASS6 is received by the third central robot CR3 in the resist film processing block 11. The third central robot CR3 places the substrate W on the substrate platform PASS4. The substrate W placed on the substrate platform PASS4 is received by the second central robot CR2 in the anti-reflection film processing block 10. The second central robot CR2 places the substrate W on the substrate platform PASS2. The substrate W placed on the substrate platform PASS2 is stored in the carrier C by the indexer robot IR in the indexer block 9.

(3) As to Top Surface and Edge Cleaning/Drying Unit

The top surface and edge cleaning/drying unit SD will be herein described in detail with reference to the drawings. Note that the operation of each of constituent elements in the top surface and edge cleaning/drying unit SD, described below, is controlled by the main controller (controller) 91 shown in FIG. 1.

(3-a) Configuration of Top Surface and Edge Cleaning/Drying Unit

Figure 4:
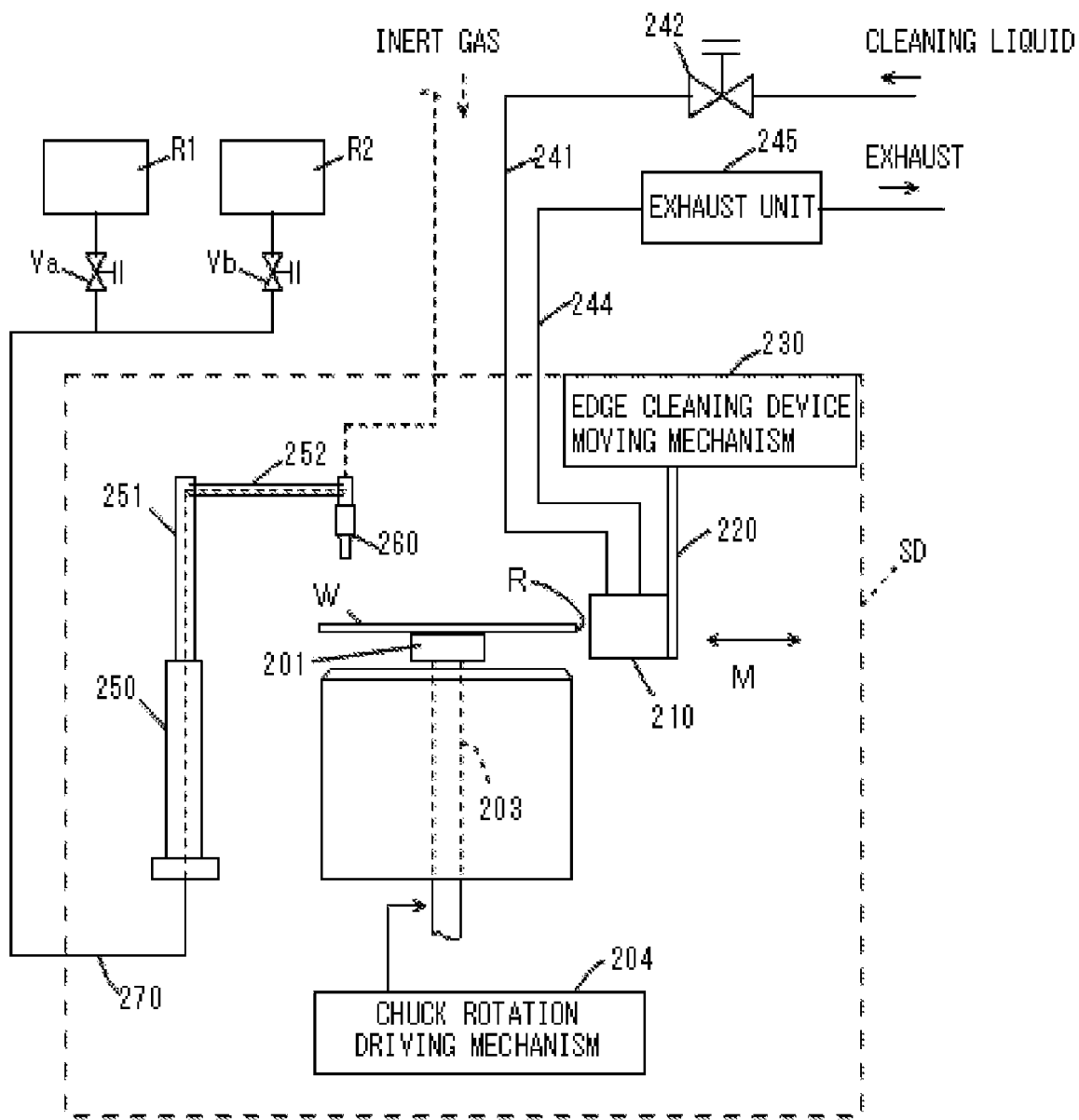
FIG. 4 is a diagram for explaining the configuration of a top surface and edge cleaning/drying unit.

FIG. 4 is a diagram for explaining the configuration of the top surface and edge cleaning/drying unit SD. In the top surface and edge cleaning/drying unit SD, the top surface and the edge of the substrate W are cleaned (top surface and edge cleaning processing).

As shown in FIG. 4, the top surface and edge cleaning/drying unit SD includes a spin chuck 201 for rotating the substrate W about a vertical rotation axis passing through the center of the substrate W while horizontally holding the substrate W. The spin chuck 201 is secured to an upper end of a rotation shaft 203 that is rotated by a chuck rotation driving mechanism 204. A suction path (not shown) is formed in the spin chuck 201. Air inside the suction path is exhausted with the substrate W placed on the spin chuck 201, to adsorb a lower surface of the substrate W on the spin chuck 201 under vacuum, so that the substrate W can be held in a horizontal attitude.

A motor 250 is provided beside the spin chuck 201. A rotation shaft 251 is connected to the motor 250. An arm 252 is connected to the rotation shaft 251 so as to extend in the horizontal direction, and its tip is provided with a top surface cleaning nozzle 260. The motor 250 causes the rotation shaft 251 to rotate while causing the arm 252 to swing. This allows the top surface cleaning nozzle 260 to move between an upper position and an outer position of the substrate W held by the spin chuck 201.

A supply pipe 270 for cleaning processing is provided so as to pass through the motor 250, the rotation shaft 251, and the arm 252. The supply pipe 270 is connected to a cleaning liquid supply source R1 and a rinse liquid supply source R2 through a valve Va and a valve Vb, respectively. By controlling the opening and closing of the valves Va and Vb, it is possible to select a processing liquid supplied to the supply pipe 270 and adjust the supply amount thereof. In the configuration shown in FIG. 4, a cleaning liquid can be supplied to the supply pipe 270 by opening the valve Va, and a rinse liquid can be supplied to the supply pipe 270 by opening the valve Vb. By thus controlling the opening and closing of the valves Va and Vb, it is possible to supply the cleaning liquid or the rinse liquid to the top surface of the substrate W through the supply pipe 270 and the top surface cleaning nozzle 260. This allows the top surface of the substrate W to be cleaned.

An example of the cleaning liquid is any one of a predetermined resist solvent, a fluorine-based medical liquid, an ammonia/hydrogen peroxide mixture, and a liquid used for the liquid immersion method in the exposure device 17. Another example of the cleaning liquid can be also any one of pure water, a pure water solution containing a complex (ionized), carbonic water, hydrogen water, electrolytic ionic water, HFE (hydrofluoroether), hydrofluoric acid, sulfuric acid, and a sulfuric acid/hydrogen peroxide mixture. An example of the rinse liquid is any one of pure water, carbonated water, hydrogen water, electrolytic ionic water, and HFE.

Furthermore, an edge cleaning device moving mechanism 230 is provided beside the spin chuck 201 and in an upper part of the top surface and edge cleaning/drying unit SD. A stick-shaped supporting member 220 extending downward is attached to the edge cleaning device moving mechanism 230. The supporting member 220 moves in the vertical direction and the horizontal direction by the edge cleaning device moving mechanism 230.

An edge cleaning device 210 having a substantially cylindrical shape is attached to a lower end of the supporting member 220 so as to extend in the horizontal direction. This causes the edge cleaning device 210, together with the supporting member 220, to move by the edge cleaning device moving mechanism 230. This allows one end of the edge cleaning device 210 to be opposite to the edge R of the substrate W held in the spin chuck 201. In the following description, the one end, which is opposite to the edge R of the substrate W, of the edge cleaning device 210 is taken as a front surface.

The definition of the edge R of the substrate W will be herein described while referring to the following drawings.

Figure 5:
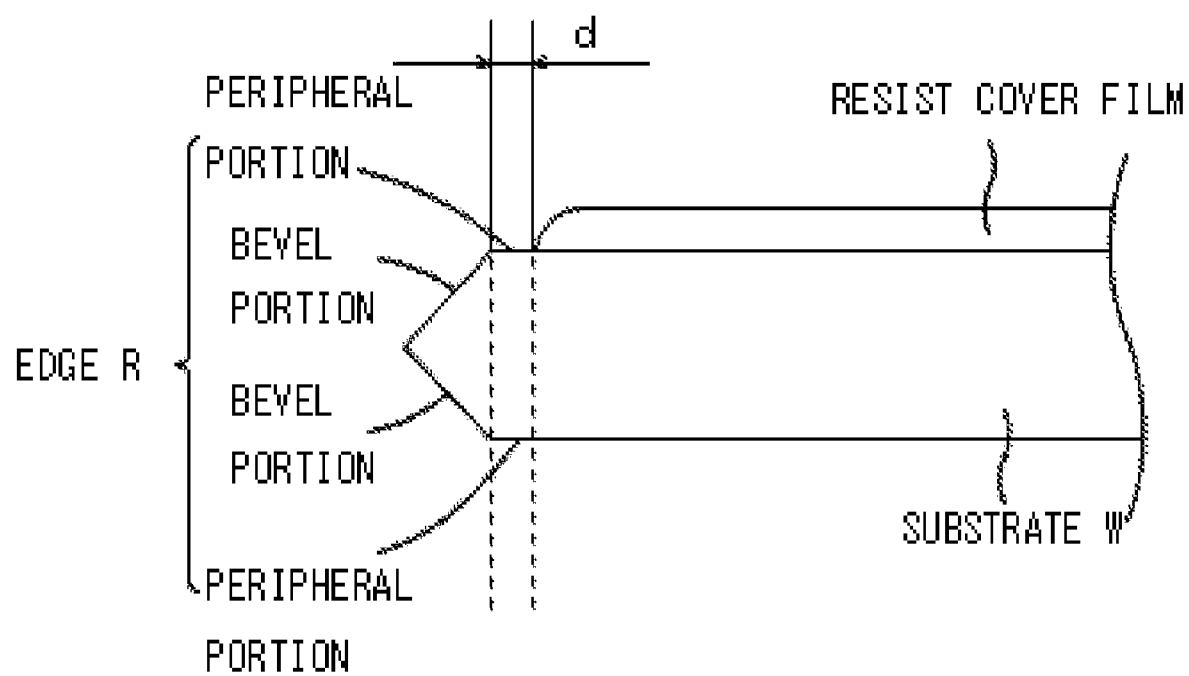
FIG. 5 is a schematic view for explaining an edge of a substrate.

FIG. 5 is a schematic view for explaining the edge R of the substrate W. As shown in FIG. 5, an anti-reflection film and a resist film (both are not illustrated) and a resist cover film, described above, are formed on the substrate W.

The substrate W has an end surface. The end surface is as schematically illustrated in FIG. 5. The end surface is generally referred to as a bevel portion. A region inwardly spaced a distance d apart from an end of the top surface of the substrate W on which the resist cover film is formed is generally referred to as a peripheral portion. In the present embodiment, the bevel portion and the peripheral portion are generically referred to as an edge R. Note that the distance d is 2 to 3 mm, for example. Furthermore, the edge R need not include the peripheral portion. In this case, the top surface and edge cleaning/drying unit SD cleans only the bevel portion at the edge R of the substrate W. Generally, the resist cover film may not be formed so as to cover the peripheral portion on the substrate W in many cases. That is, one or both of the anti-reflection film and the resist film formed in the peripheral portion on the substrate W is/are exposed.

Returning to FIG. 4, the edge cleaning device 210 moves to a position in the vicinity of the edge R of the substrate W on the spin chuck 201 by the edge cleaning device moving mechanism 230 during the top surface and edge cleaning processing, while waiting outside the spin chuck 201 in a time period during which the top surface and edge cleaning processing is not performed. The edge cleaning device 210 has a space in its inner part (a cleaning chamber 211, described later). A cleaning liquid supply pipe 241 and an exhaust pipe 244 are connected to the edge cleaning device 210. The cleaning liquid supply pipe 241 is connected to a cleaning liquid supply system (not shown) through a valve 242. By opening the valve 242, the cleaning liquid is supplied to the inner space of the edge cleaning device 210 through the cleaning liquid supply pipe 241.

Furthermore, the exhaust pipe 244 is connected to an exhaust unit 245. The exhaust unit 245 sucks in an atmosphere in the inner space of the edge cleaning device 210, and exhausts the air through the exhaust pipe 244.

Figure 6:
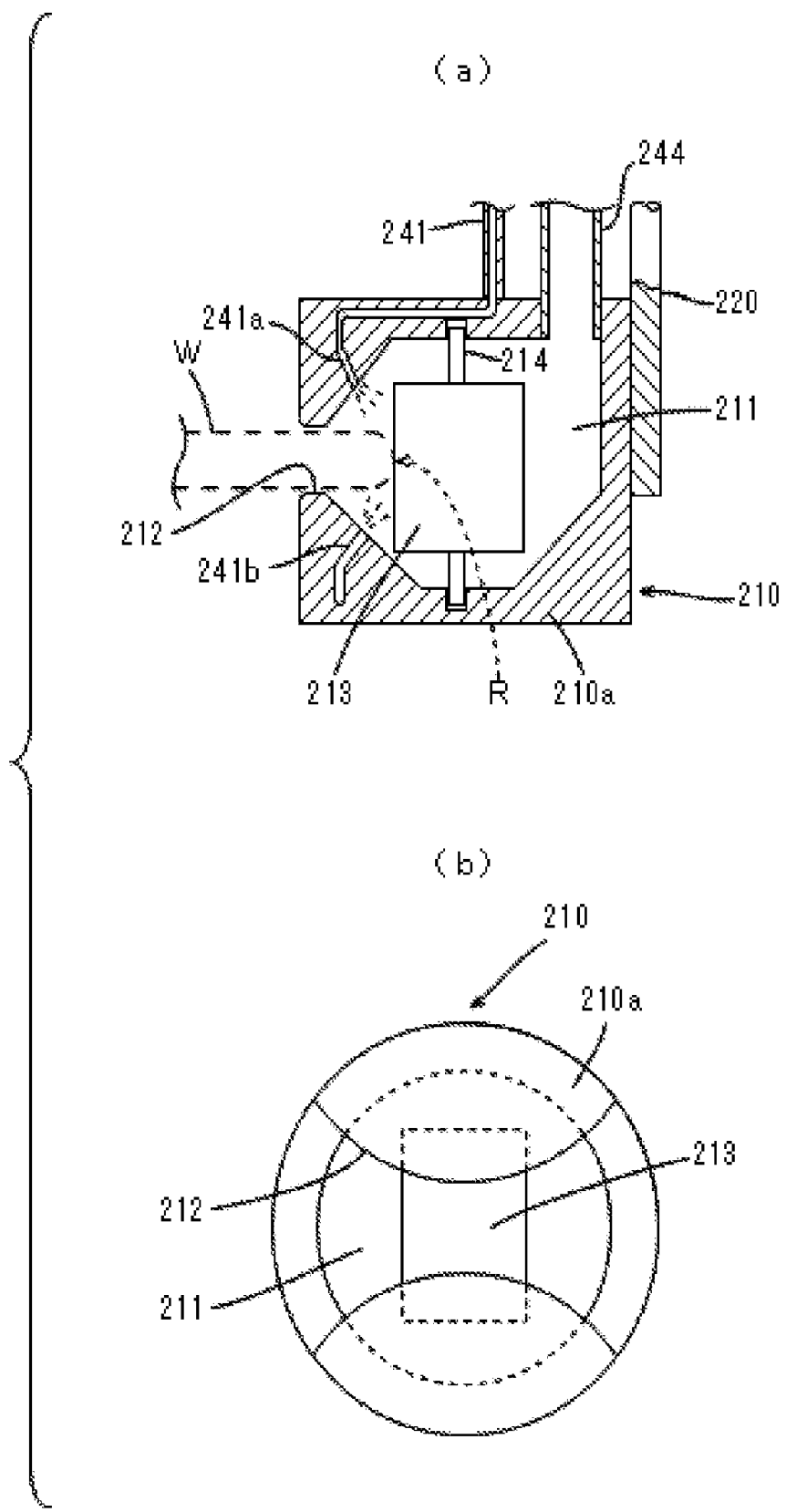
FIG. 6 is a diagram for explaining the configuration of an edge cleaning device in the top surface and edge cleaning/drying unit shown in FIG. 4.

The details of the edge cleaning device 210 will be herein described. FIG. 6 is a diagram for explaining the configuration of the edge cleaning device 210 in the top surface and edge cleaning/drying unit SD shown in FIG. 4. FIG. 6 (a) is a vertical sectional view of the edge cleaning device 210, and FIG. 6 (b) is a front view of the edge cleaning device 210. As shown in FIG. 6 (a), a cleaning chamber 211 is formed inside a substantially cylindrical housing 210a in the edge cleaning device 210. Furthermore, as shown in FIGS. 6 (a) and 6 (b), an opening 212 for causing the cleaning chamber 211 and the outside of the housing 210a to communicate with each other is formed on the side of a front surface of the housing 210a. The opening 212 has an upper surface and a lower surface in a circular arc shape such that the vertical width thereof is gradually enlarged sideward on both sides from the center thereof. During the top surface and edge cleaning processing of the substrate W, the edge R of the substrate W held by suction on the spin chuck 201 is inserted into the opening 212.

A brush 213 having a substantially cylindrical shape is arranged so as to extend in the vertical direction within the cleaning chamber 211. The brush 213 is attached to a rotation shaft 214 extending in the vertical direction. An upper end and a lower end of the rotation shaft 214 are respectively attached to rotation bearings formed at the top and the bottom of the cleaning chamber 211. This causes the brush 213 to be rotatably supported by the cleaning chamber 211 and the rotation shaft 214. During the top surface and edge cleaning processing of the substrate W, the edge R of the rotating substrate W and the brush 213 come into contact with each other. This causes the edge R of the substrate W to be cleaned with the brush 213.

Here, in the top surface and edge cleaning/drying unit SD shown in FIG. 4, the rotation shaft 214 having the brush 213 attached thereto is arranged so as to be substantially parallel to the rotation shaft 203 having the spin chuck 201 secured thereto. This causes the brush 213 to rotate with the brush 213 brought into reliable contact with the edge R of the rotating substrate W.

The cleaning liquid supply pipe 241 and the exhaust pipe 244, described above, are connected to the top of the edge cleaning device 210. The cleaning liquid supply pipe 241 is connected to cleaning liquid supply paths 241a and 241b formed within the housing 210a. As shown in FIG. 6 (a), the cleaning liquid supply path 241a extends to an inner surface in an upper part of the cleaning chamber 211 from the outside of the housing 210a. The cleaning liquid supply path 241b extends to an inner surface in a lower part of the cleaning chamber 211 from the outside of the housing 210a. FIG. 6 (a) illustrates only a part of the cleaning liquid supply pipe 241b.

Such a configuration causes the cleaning liquid supplied to the edge cleaning device 210 to be sprayed in the vertical direction toward the edge R of the substrate W that comes into contact with the brush 213 within the cleaning chamber 211 during the top surface and edge cleaning processing of the substrate W. This causes the edge R of the substrate W to be efficiently cleaned. The exhaust pipe 244 is inserted into the cleaning chamber 211 through a hole provided at the top of the housing 210a. This causes an atmosphere in the cleaning chamber 211 to be sucked in by the exhaust unit 245 shown in FIG. 4 and exhausted through the exhaust pipe 244, as described above. In the cleaning chamber 211, the exhaust unit 245 thus exhausts the atmosphere inside thereof, so that the volatilized cleaning liquid and a mist of the cleaning liquid are efficiently exhausted.

In the foregoing, an example of the cleaning liquid sprayed on the edge R of the substrate W is any one of a predetermined resist solvent, a fluorine-based medical liquid, an ammonia/hydrogen peroxide mixture, and a liquid used for the liquid immersion method in the exposure device 17. Another example of the cleaning liquid can be also any one of pure water, a pure water solution containing a complex (ionized), carbonic water, hydrogen water, electrolytic ionic water, HFE (hydrofluoroether), hydrofluoric acid, sulfuric acid, and a sulfuric acid/hydrogen peroxide mixture, similarly to the example of the cleaning liquid for cleaning the top surface of the substrate W.

When the edge R of the substrate W is cleaned with the brush 213, as described above, the brush 213 is brought into direct contact with the edge R of the substrate W, so that a contaminant at the edge R of the substrate W can be physically stripped. This allows the contaminant that has firmly adhered to the edge R to be more reliably removed.

(3-b) Operations of Top Surface and Edge Cleaning/Drying Unit

The processing operations of the top surface and edge cleaning/drying processing unit SD having the above-mentioned configuration will be described. When the substrate W is carried into the top surface and edge cleaning/drying unit SD, the seventh central robot CR7 shown in FIG. 1 places the substrate W on the spin chuck 201. The substrate W placed on the spin chuck 201 is held by suction on the spin chuck 201. Then, the top surface cleaning nozzle 260 moves to above the center of the substrate W while the edge cleaning device 210 moves to a position in the vicinity of the edge R of the substrate W on the spin chuck 201. The rotation shaft 203 rotates so that the substrate W rotates.

In this case, the cleaning liquid is discharged to the top surface of the substrate W from the top surface cleaning nozzle 260. This causes the top surface of the substrate W to be cleaned. At the same time, the cleaning liquid is supplied to the edge cleaning device 210. This causes the edge R of the substrate W to be cleaned. After an elapse of a predetermined time period, the top surface cleaning nozzle 260 discharges the rinse liquid to the top surface of the substrate W in place of the cleaning liquid. This causes the cleaning liquid supplied onto the substrate W to be cleaned away. At this time, the supply of the cleaning liquid to the edge cleaning device 210 is stopped. Thus, the rinse liquid discharged to the top surface of the substrate W flows into the edge R of the substrate W, so that the cleaning liquid that adheres to the edge R of the substrate W is cleaned away.

Furthermore, after an elapse of a predetermined time period, the top surface cleaning nozzle 260 stops to discharge the rinse liquid to the substrate W, to move outward apart from the substrate W held by the spin chuck 201. The edge cleaning device 210 also moves outward apart from the substrate W. The number of revolutions of the rotation shaft 203 increases. This causes a great centrifugal force to act on the rinse liquid remaining on the substrate W. Thus, the liquid that adheres to the top surface and the edge R of the substrate W is scattered, so that the substrate W is dried.

Note that in the cleaning/drying processing group 80, a component of the resist cover film on the substrate W is eluted in the cleaning liquid during the above-mentioned top surface and edge cleaning processing. This can prevent the component of the resist cover film that has been eluted in the cleaning liquid from remaining on the substrate W. Note that the component of the resist cover film may be eluted in pure water with the pure water poured onto the substrate W and held thereon for a certain time period, for example.

The cleaning liquid and the rinse liquid may be supplied onto the substrate W by means of a soft spray method using a two-fluid nozzle that discharges a fluid mixture of a gas and a liquid. When the two-fluid nozzle is used as the top surface cleaning nozzle 260 shown in FIG. 4, the two-fluid nozzle that sprays the fluid mixture is moved so as to pass through the center of the rotating substrate W from the outside of the substrate W. This allows the fluid mixture including the cleaning liquid or the rinse liquid to be efficiently sprayed over the whole surface of the substrate W. When the two-fluid nozzle is thus used, inert gas such as nitrogen gas ($N_2$), argon gas, or helium gas must be supplied to the top surface cleaning nozzle 260, as indicated by a dotted line in FIG. 4.

Figure 7:
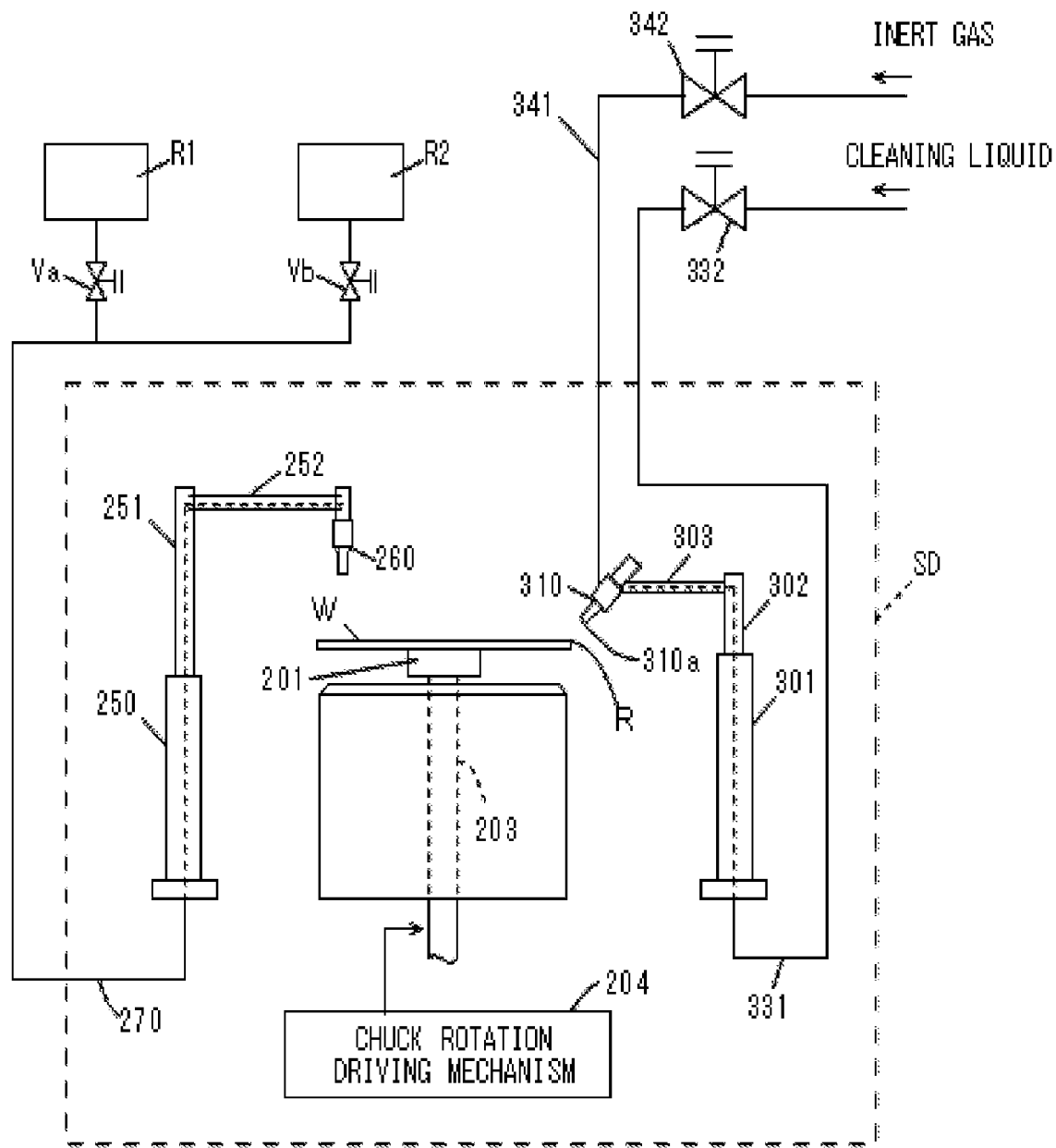
FIG. 7 is a diagram for explaining another example of the configuration of the top surface and edge cleaning/drying unit.

(3-c) Another Example of Configuration of Top Surface and Edge Cleaning/Drying Unit The top surface and edge cleaning/drying unit SD may have the following configuration. FIG. 7 is a diagram for explaining another example of the configuration of the top surface and edge cleaning/drying unit SD. The difference between the top surface and edge cleaning/drying unit SD shown in FIG. 7 and the top surface and edge cleaning/drying unit SD shown in FIG. 4 will be described.

As shown in FIG. 7, in the top surface and edge cleaning/drying unit SD in this example, a two-fluid nozzle 310 is provided as a constituent element for cleaning an edge R of a substrate W in place of the edge cleaning device 210 shown in FIG. 4. Specifically, a motor 301 is provided outside a spin chuck 201. A rotation shaft 302 is connected to the motor 301. An arm 303 is connected to the rotation shaft 302 so as to extend in the horizontal direction, and the two-fluid nozzle 310 is provided at the tip of the arm 303. The two-fluid nozzle 310 discharges a fluid mixture of a gas and a liquid.

Note that at the tip of the arm 303, the two-fluid nozzle 310 is attached thereto so as to be inclined to the top surface of the substrate W held by the spin chuck 201. When top surface and edge cleaning processing of the substrate W is started, the motor 301 causes the rotation shaft 302 to rotate while causing the arm 303 to swing. This causes the two-fluid nozzle 310 to move to above the edge R of the substrate W held by the spin chuck 201. As a result, a discharge section 310a of the fluid mixture in the two-fluid nozzle 310 is opposite to the edge R of the substrate W.

A cleaning liquid supply pipe 331 is provided so as to pass through the motor 301, the rotation shaft 302, and the arm 303. The cleaning liquid supply pipe 331 has its one end connected to the two-fluid nozzle 310 and the other end connected to a cleaning liquid supply system (not shown) through a valve 332. A cleaning liquid is supplied to the two-fluid nozzle 310 through the cleaning liquid supply pipe 331 by opening the valve 332. One end of a gas supply pipe 341, together with the cleaning liquid supply pipe 331, is connected to the two-fluid nozzle 310. The other end of the gas supply pipe 341 is connected to a gas supply system (not shown) through a valve 342. A gas is supplied to the two-fluid nozzle 310 by opening the valve 342. An example of the gas supplied to the two-fluid nozzle 310 is inert gas such as nitrogen gas ($N_2$), argon gas, or helium gas.

When the substrate W is subjected to the top surface and edge cleaning processing, the cleaning liquid and the gas are supplied to the two-fluid nozzle 310. This causes the cleaning liquid and a rinse liquid to be discharged from the top surface cleaning nozzle 260 to the top surface of the substrate W while causing the fluid mixture to be discharged from the two-fluid nozzle 310 to the edge R of the rotating substrate W. Thus, a high cleaning effect can be obtained by using the fluid mixture. This causes the edge R of the substrate W to be satisfactorily cleaned. The fluid mixture of the gas and the liquid is discharged to the edge R of the substrate W, so that the edge R of the substrate W is cleaned in non-contact, which prevents the edge R of the substrate W from being damaged during the cleaning. Furthermore, it is also possible to easily control the cleaning conditions of the edge R of the substrate W by controlling the discharge pressure of the fluid mixture and the ratio of the gas and the liquid in the fluid mixture. Furthermore, the two-fluid nozzle 310 allows the uniform fluid mixture to be discharged to the edge R of the substrate W, which prevents the edge R from being non-uniform in cleaning.

(3-d) Still Another Example of Configuration of Edge Cleaning Unit

Figure 8:
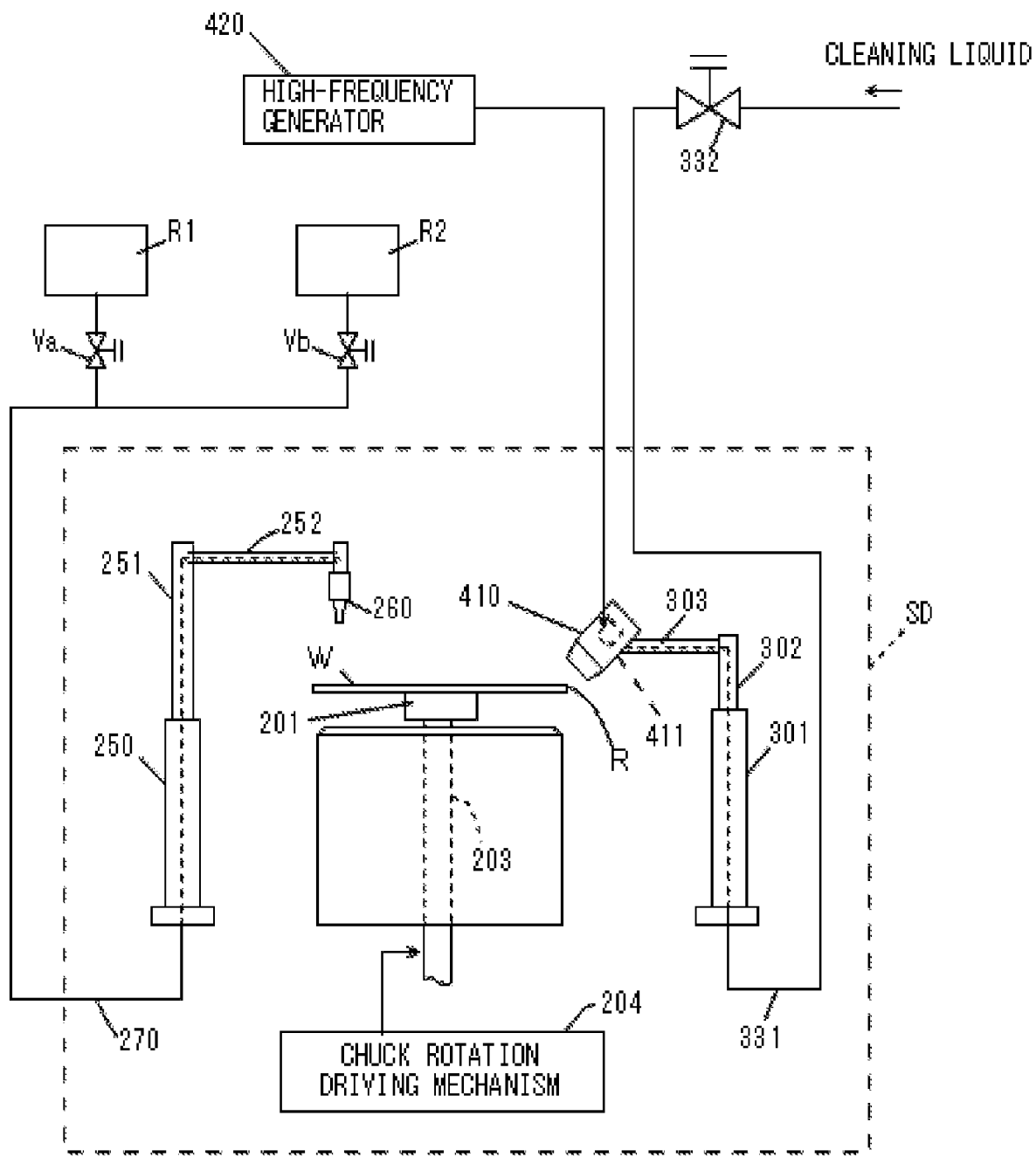
FIG. 8 is a diagram for explaining still another example of the configuration of the top surface and edge cleaning/drying unit.

The top surface and edge cleaning/drying unit SD may have the following configuration. FIG. 8 is a diagram for explaining still another example of the configuration of the top surface and edge cleaning/drying unit SD. The difference between the top surface and edge cleaning/drying unit SD shown in FIG. 8 and the top surface and edge cleaning/drying unit SD shown in FIG. 7 will be described. As shown in FIG. 8, in the top surface and edge cleaning/drying unit SD in this example, a ultrasonic nozzle 410 is provided in place of the two-fluid nozzle 310 at the tip of an arm 303. In this example, the ultrasonic nozzle 410 is also attached to the tip of the arm 303 so as to be inclined to a top surface of a substrate W held by a spin chuck 201.

A cleaning liquid supply pipe 331 is connected to the ultrasonic nozzle 410. Therefore, a cleaning liquid is supplied to the ultrasonic nozzle 410 through the cleaning liquid supply pipe 331 by opening a valve 332, as in the example shown in FIG. 7. A high-frequency vibrator 411 is contained in the ultrasonic nozzle 410. The high-frequency vibrator 411 is electrically connected to a high-frequency generator 420. When the substrate W is subjected to edge cleaning processing, pure water is discharged toward an edge R of the substrate W from the ultrasonic nozzle 410. Here, when the pure water is discharged from the ultrasonic nozzle 410, a high-frequency current is supplied to the high-frequency vibrator 411 from the high-frequency generator 420. Thus, the high-frequency vibrator 411 is ultrasonically vibrated, to apply a high-frequency output corresponding to the value of the high-frequency current to the pure water passing through the ultrasonic nozzle 410. As a result, the pure water in a ultrasonically vibrated state is discharged to the edge R of the substrate W, to clean the edge R of the substrate W.

(4) Effects of First Embodiment (4-a) First Effect of Top Surface and Edge Cleaning Processing In the substrate processing apparatus 500 according to the first embodiment, the top surface and edge cleaning/drying unit SD in the cleaning/drying processing group 80 subjects the substrate W before the exposure processing to the top surface and edge cleaning processing. This causes the top surface and the edge R of the substrate W carried into the exposure device 17 to be kept clean. As a result, contamination in the exposure device 17 due to contamination on the top surface and the edge R of the substrate W before the exposure processing can be sufficiently prevented, which sufficiently prevents a defective dimension and a defective shape of an exposure pattern.

(4-b) Second Effect of Top Surface and Edge Cleaning Processing

In the substrate processing apparatus 500 according to the first embodiment, the top surface and the edge R of the substrate W can be concurrently or simultaneously cleaned in the top surface and edge cleaning/drying unit SD, as described above. This eliminates the necessity of individually cleaning the top surface and the edge R of the substrate W before the exposure processing, which inhibits throughput in substrate processing from being reduced.

The top surface cleaning unit that cleans the top surface of the substrate W and the edge cleaning unit that cleans the edge R of the substrate W need not be individually provided. This causes the cleaning/drying processing block 15 to be miniaturized. Furthermore, throughput in substrate processing can be also further improved by increasing the number of top surface and edge cleaning/drying units SD provided within the cleaning/drying processing block 15. Another processing unit can be also provided within the cleaning/drying processing group 80 in the cleaning/drying processing block 15.

(4-c) Effects of Development Processing Block

Generally in the substrate processing apparatus having a plurality of blocks provided side by side therein, a development processing block that subjects the substrate W to development processing is provided with a development processing group for subjecting the substrate W to the development processing and a thermal processing group for subjecting the substrate after the development processing to thermal processing. Furthermore, when the development processing block is provided with a central robot that transports the substrate, the development processing group and the thermal processing group for development are generally provided so as to be opposite to each other with the central robot interposed therebetween.

On the other hand, in the development processing block 13 in the substrate processing apparatus 500 according to the first embodiment, the development processing groups 60a and 60b are provided opposite to each other with the fifth central robot CR5 interposed therebetween. That is, in the development processing block 13, the development processing group 60a is provided at a position of the thermal processing group for development to be generally provided. Thus, the development processing block 13 includes a larger number of (eight) development processing units DEV, as compared with those in the conventional substrate processing apparatus.

Even when a time period required for the development processing is lengthened, therefore, the large number of development processing units DEV can subject a large number of substrates W to development processing, which allows throughput in substrate processing of the whole substrate processing apparatus to be sufficiently improved.

(5) Others

In order to previously elude or deposit a component of a film on the substrate W, it is preferable that a liquid (an immersion liquid) used for the liquid immersion method in the exposure device 17 is used as the cleaning liquid used in the above-mentioned top surface and edge cleaning processing. Examples of the immersion liquid include pure water, glycerol with a high refractive index, a liquid mixture of fine particles with a high refractive index (e.g., aluminum oxide) and pure water, and an organic liquid. Other examples of the immersion liquid include a pure water solution containing a complex (ionized), carbonic water, hydrogen water, electrolytic ionic water, HFE (hydrofluoroether), hydrofluoric acid, sulfuric acid, and a sulfuric acid/hydrogen peroxide mixture.

In the present embodiment, before the exposure device 17 subjects the substrate W to the exposure processing, the resist cover film is formed on the resist film in the resist cover film processing block 12. In this case, even if the substrate W is brought into contact with the liquid in the exposure device 17, the resist cover film prevents the resist film from coming into contact with the liquid, which prevents a component of the resist from being eluted in the liquid.

<2> Second Embodiment

The difference between a substrate processing apparatus according to a second embodiment of the present invention and the substrate processing apparatus 500 according to the first embodiment will be now described.

(1) Configuration of Substrate Processing Apparatus

Figure 9:
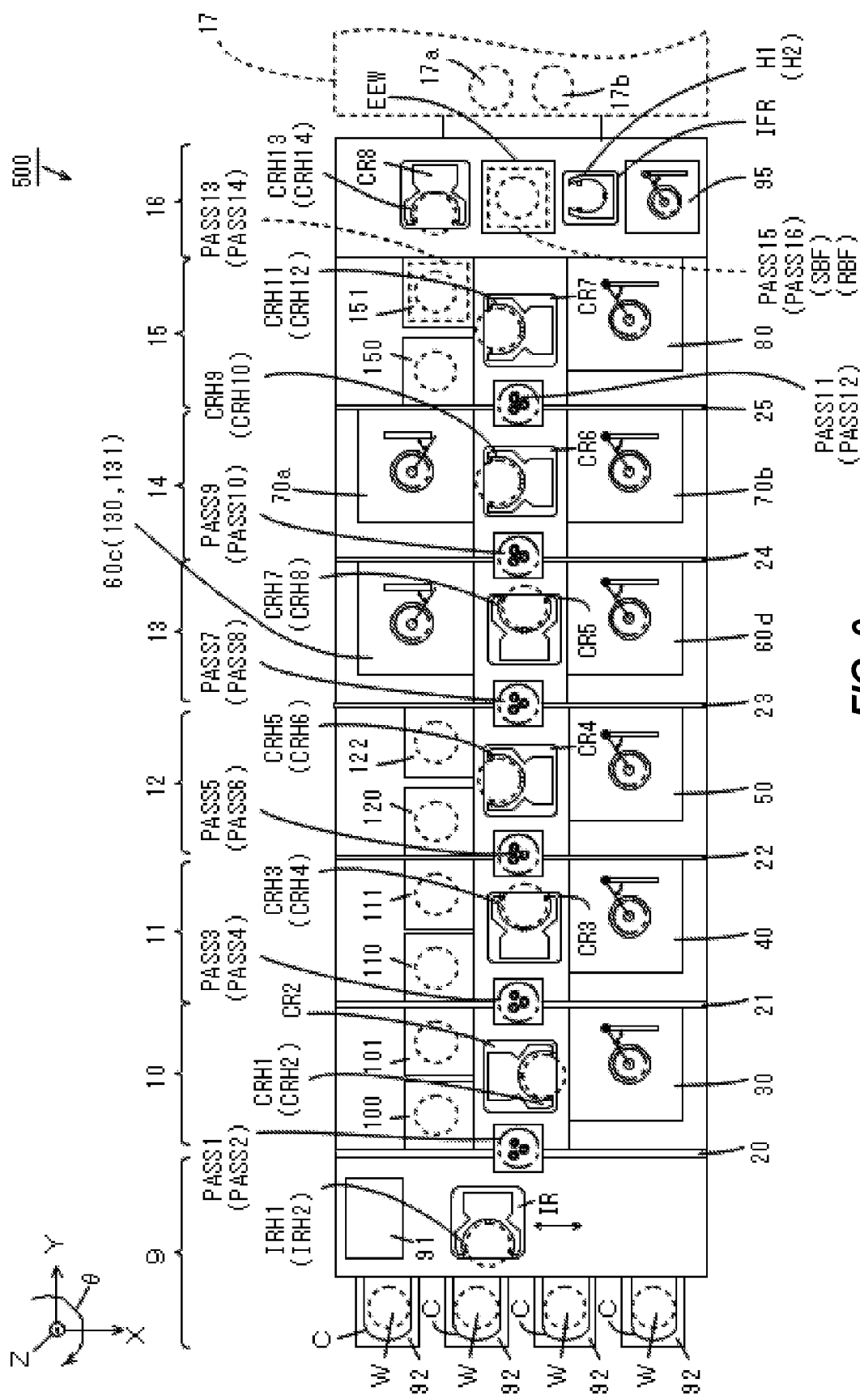
FIG. 9 is a plan view of a substrate processing apparatus according to a second embodiment.
Figure 10:
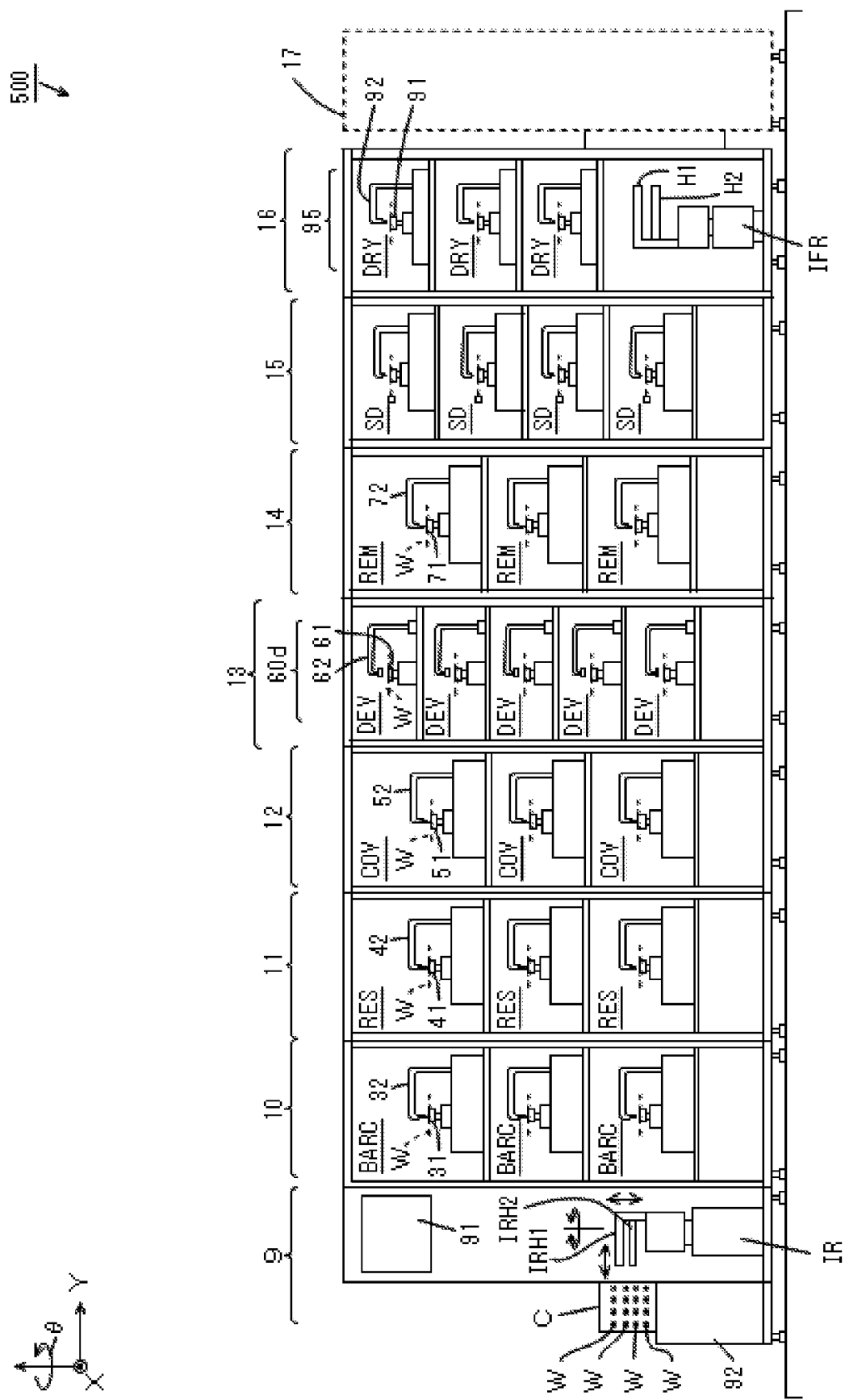
FIG. 10 is a side view on one side of the substrate processing apparatus shown in FIG. 9.
Figure 11:
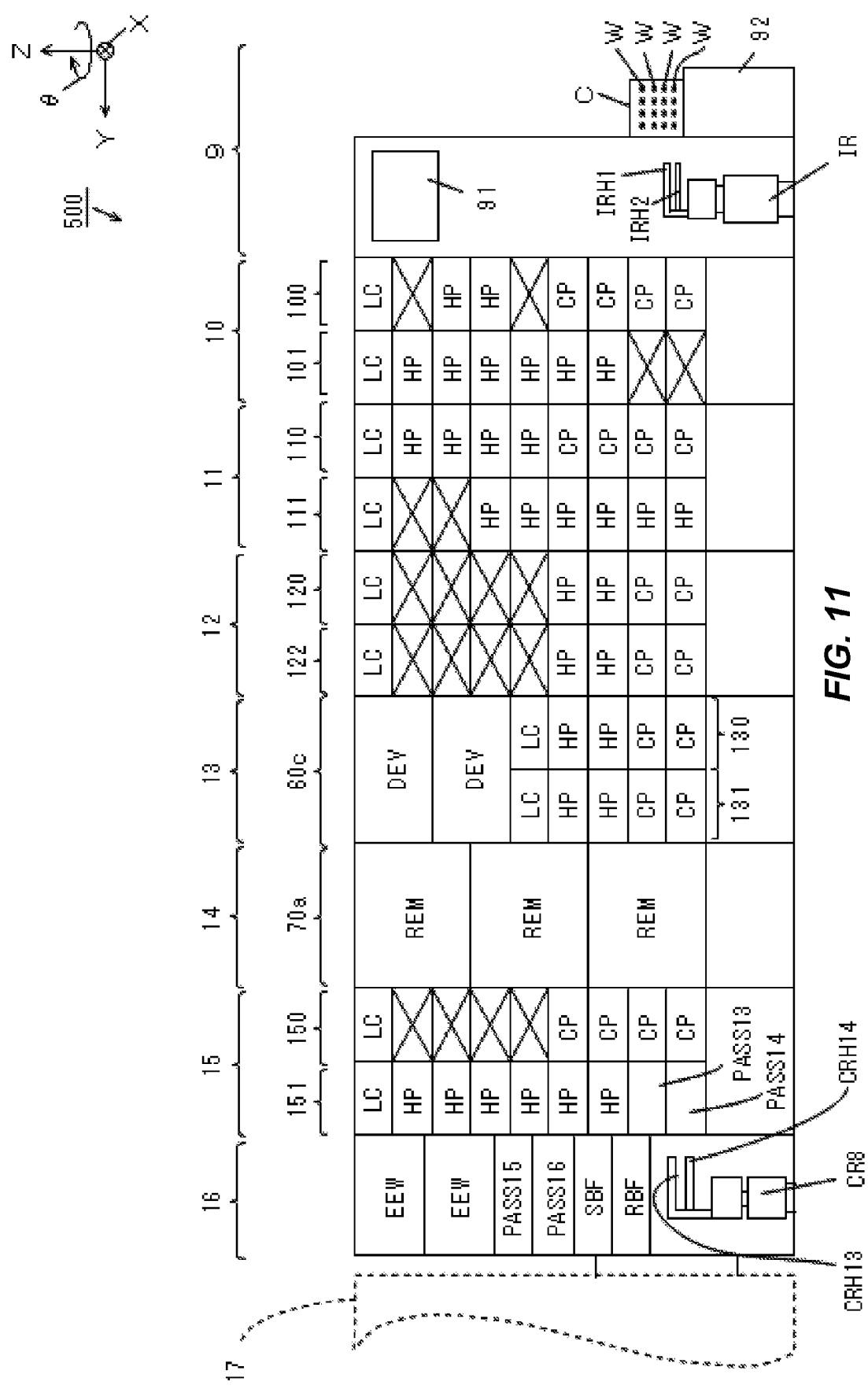
FIG. 11 is a side view on the other side of the substrate processing apparatus shown in FIG. 9.

FIG. 9 is a plan view of a substrate processing apparatus 500 according to a second embodiment, FIG. 10 is a side view on one side of the substrate processing apparatus 500 shown in FIG. 9, and FIG. 11 is a side view on the other side of the substrate processing apparatus 500 shown in FIG. 9. As shown in FIGS. 9 to 11, the substrate processing apparatus 500 according to the present embodiment differs from the substrate processing apparatus 500 according to the first embodiment in the configuration of a resist cover film processing block 12.

The resist cover film processing block 12 includes thermal processing groups 120 and 122 for resist cover film, a coating processing group 50 for resist cover film, and a fourth central robot CR4. The coating processing group 50 is provided opposite to the thermal processing groups 120 and 122 with the fourth central robot CR4 interposed therebetween. As shown in FIG. 11, the thermal processing group 122 has a vertical stack of two heating units HP and two cooling units CP.

The substrate processing apparatus 500 according to the present embodiment differs from the substrate processing apparatus 500 according to the first embodiment in the configuration of a development processing block 13. The development processing block 13 includes development processing groups 60c and 60d, thermal processing groups 130 and 131 for development, and a fifth central robot CR5. Here, as shown in FIG. 11, the development processing group 60c is stacked on the thermal processing groups 130 and 131. Thus, in the development processing block 13, the development processing group 60d is provided opposite to the development processing group 60c and the thermal processing groups 130 and 131 with the fifth central robot CR5 interposed therebetween.

As shown in FIG. 10, the development processing group 60d has a vertical stack of five development processing units DEV. As shown in FIG. 11, the development processing group 60c has a vertical stack of two development processing units DEV. Each of the thermal processing groups 130 and 131 has a vertical stack of two heating units HP and two cooling units CP. Each of the thermal processing groups 130 and 131 also has a local controller LC for controlling the respective temperatures of the heating unit HP and the cooling unit CP arranged in its uppermost part.

(2) Operations of Substrate Processing Apparatus

By the above-mentioned configuration, the substrate processing apparatus 500 according to the present embodiment performs operations different from those in the first embodiment. First, in the second embodiment, carriers C are also respectively placed on carrier platforms 92 in an indexer block 9. An unprocessed substrate W that is stored in the carrier C is received by an indexer robot IR, and is placed on a substrate platform PASS5 by being transported in the same manner as that in the first embodiment.

The substrate W placed on the substrate platform PASS5 is received by a fourth central robot CR4 in the resist cover film processing block 12. The fourth central robot CR4 carries the substrate W into the coating processing group 50. This causes a coating of a resist cover film to be formed on a resist film. Thereafter, the fourth central robot CR4 then takes out the substrate W that has been subjected to coating processing from the coating processing group 50, and carries the substrate W into the thermal processing group 120 or 122. The fourth central robot CR4 then takes out the thermally processed substrate W from the thermal processing group 120 or 122, and places the substrate W on a substrate platform PASS7.

The substrate W placed on the substrate platform PASS7 is received by the fifth central robot CR5 in the development processing block 13, and is transported to an exposure device 17 in the same manner as that in the first embodiment. The substrate W after exposure processing by the exposure device 17 is taken out by an interface transporting mechanism IFR, and is placed on a substrate platform PASS10 by being transported in the same manner as that in the first embodiment. The substrate W placed on the substrate platform PASS10 is received by the fifth central robot CR5 in the development processing block 13. The fifth central robot CR5 carries the substrate W into the development processing group 60c or 60d. In the development processing groups 60c or 60d, the development processing unit DEW subjects the substrate W to development processing. Thereafter, the fifth central robot CR5 takes out the substrate W that has been subjected to the development processing from the development processing group 60c or 60d, and carries the substrate W into the thermal processing group 130 or 131. The fifth central robot CR5 then takes out the thermally processed substrate W from the thermal processing group 130 or 131, and places the substrate W on a substrate platform PASS8.

The substrate W placed on the substrate platform PASS8 is received by the fourth central robot CR4 in the resist cover film processing block 12. The fourth central robot CR4 places the substrate W on a substrate platform PASS6. The substrate W placed on the substrate platform PASS6 is transported to the indexer block 9 and stored in the carrier C in the same manner as that in the first embodiment.

(3) Effects of Second Embodiment

Generally in the substrate processing apparatus having a plurality of blocks provided side by side therein, the development processing block in which the substrate W is subjected to development processing is provided with a development processing group that subjects the substrate W to the development processing and a thermal processing group for subjecting the substrate W after the development processing to thermal processing.

Furthermore, when the development processing block is provided with a central robot that transports the substrate W, the development processing group and the thermal processing group for development are generally provided so as to be opposite to each other with the central robot interposed therebetween. On the other hand, in the development processing block 13 in the substrate processing apparatus 500 according to the second embodiment, the development processing groups 60a and 60b are provided opposite to each other with the fifth central robot CR5 interposed therebetween. Thus, the development processing block 13 includes a larger number of (seven in this example) development processing units DEV, as compared with those in the conventional substrate processing apparatus.

Even when a time period required for the development processing is lengthened, therefore, the large number of development processing units DEV can subject a large number of substrates W to development processing, which allows throughput in substrate processing of the whole substrate processing apparatus to be sufficiently improved. In addition, in the present embodiment, the development processing block 13 includes the thermal processing groups 130 and 131 together with the development processing groups 60c and 60d, so that the substrate W after the development processing can be quickly subjected to thermal processing.

<3> Third Embodiment

The difference between a substrate processing apparatus according to a third embodiment of the present invention and the substrate processing apparatus 500 according to the first embodiment will be now described.

(1) Configuration of Substrate Processing Apparatus

Figure 12:
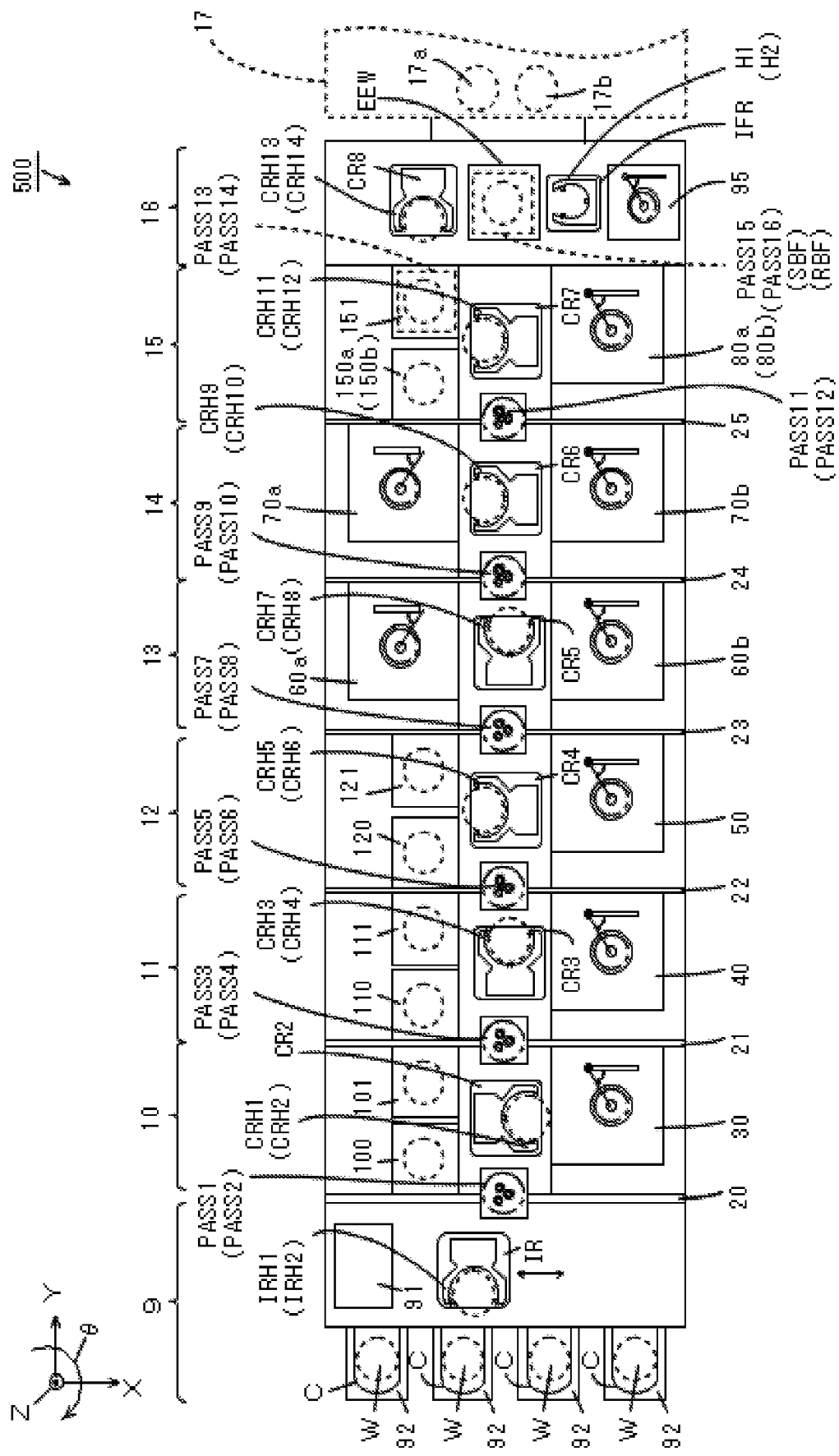
FIG. 12 is a plan view of a substrate processing apparatus according to a third embodiment.
Figure 13:
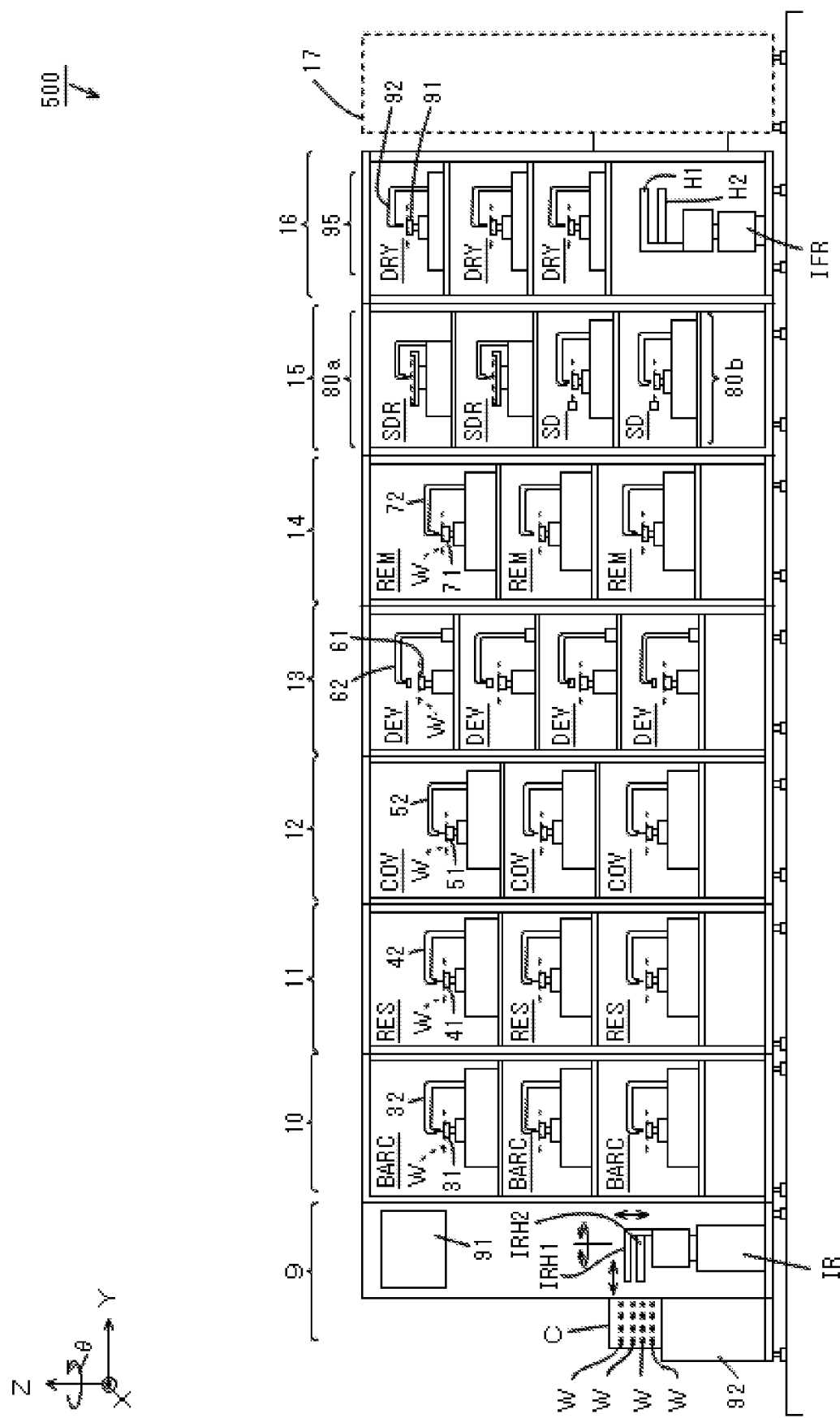
FIG. 13 is a side view on one side of the substrate processing apparatus shown in FIG. 12.
Figure 14:
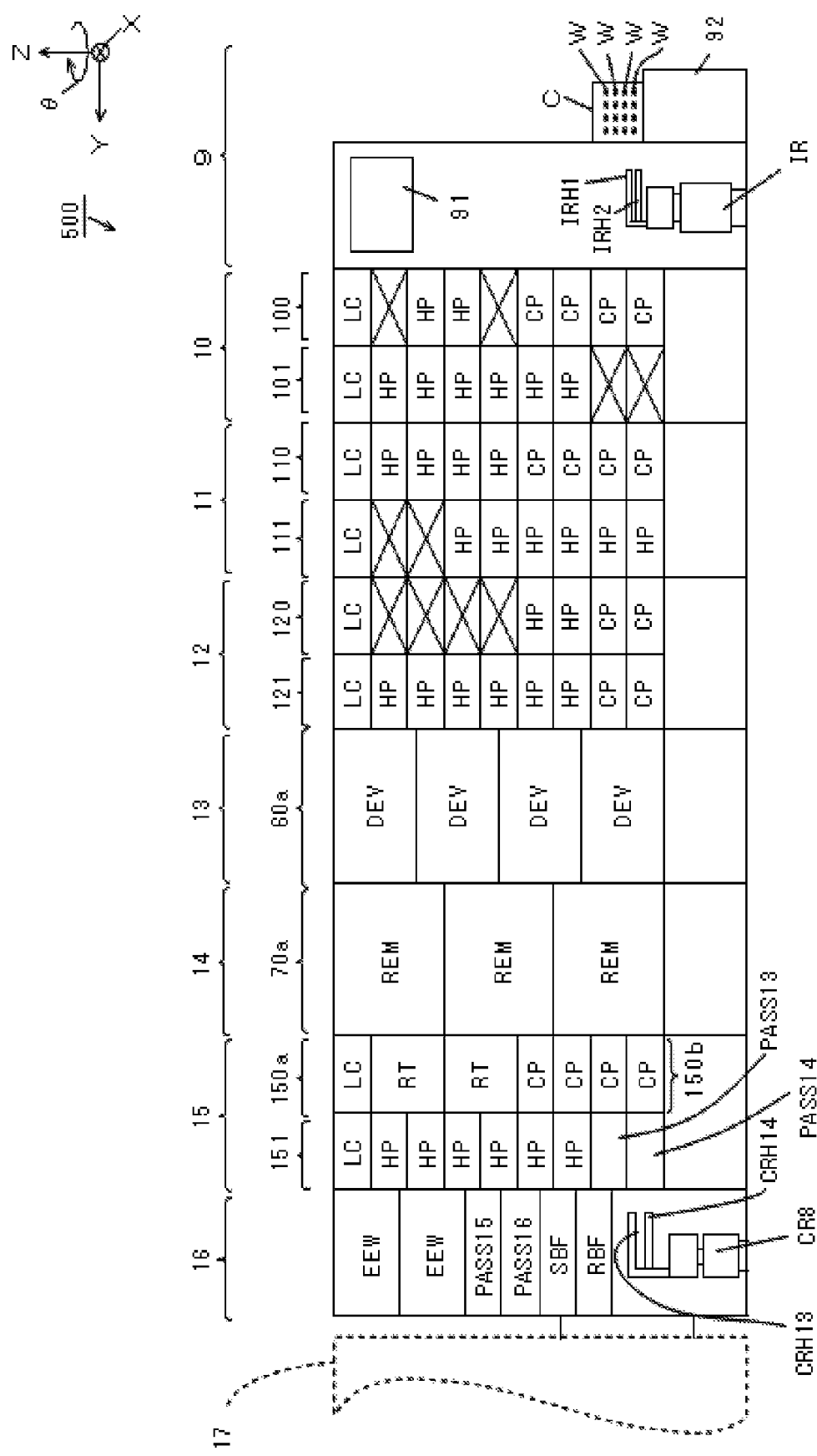
FIG. 14 is a side view on the other side of the substrate processing apparatus shown in FIG. 12.

FIG. 12 is a plan view of a substrate processing apparatus according to a third embodiment, FIG. 13 is a side view on one side of the substrate processing apparatus 500 shown in FIG. 12, and FIG. 14 is a side view on the other side of the substrate processing apparatus 500 shown in FIG. 12. As shown in FIGS. 12 to 14, the substrate processing apparatus 500 according to the present embodiment differs from the substrate processing apparatus 500 according to the first embodiment in the configuration of a cleaning/drying processing block 15.

The cleaning/drying processing block 15 includes a substrate reversing group 150a, thermal processing groups 150 and 150 for post-exposure bake, a first cleaning/drying processing group 80a, a second cleaning/drying processing group 80b, and a seventh central robot CR7. The first cleaning/drying processing group 80a and the second cleaning/drying processing group 80b are vertically stacked in this order. The first and second cleaning/drying processing groups

80a and 80b are provided opposite to the substrate reversing group 150a and the thermal processing groups 150 and 151 with the seventh central robot CR7 interposed therebetween.

As shown in FIG. 13, the first cleaning/drying processing group 80a has a vertical stack of two back surface cleaning unit SDRs, and the second cleaning/drying processing group 80b has a vertical stack of two top surface and edge cleaning/drying units SDs. Here, the back surface cleaning unit SDR is used for cleaning a back surface of a substrate W. The substrate W is carried into the back surface cleaning unit SDR with the back surface thereof directed upward. The details of the back surface cleaning unit SDR will be described later.

As shown in FIG. 14, in the cleaning/drying processing block 15, the thermal processing group 151 is provided adjacent to an interface block 16. The thermal processing group 151 has a vertical stack of six heating units HP and substrate platforms PASS13 and PASS14. The thermal processing group 151 has a local controller LC arranged at its uppermost part. The substrate reversing group 150a and the thermal processing group 150b are vertically stacked in this order adjacent to the thermal processing group 151.

The substrate reversing group 150a has a vertical stack of two reversing units RT. The thermal processing group 150b has a vertical stack of four cooling units CP. Furthermore, the substrate reversing group 150a has a local controller LC for controlling the operation of the reversing unit RT and the temperature of the cooling unit CP in the thermal processing group 150b, described later, arranged in its uppermost part. Here, the reversing unit RT is used for reversing one surface (top surface) and the other surface (back surface) of the substrate W. When the top surface of the substrate W is directed upward, for example, the reversing unit RT reverses the substrate W such that the back surface thereof is directed upward. The details of the reversing unit RT will be described later.

(2) Operations of Substrate Processing Apparatus

By the above-mentioned configuration, operations different from those in the first embodiment are performed in the substrate processing apparatus 500 according to the present embodiment. First, in the third embodiment, carriers C are also respectively placed on carrier platforms 92 in an indexer block 9. Here, in the present embodiment, a plurality of substrates W that are stored in each of the carriers C are held with their top surfaces directed upward. The unprocessed substrate W that is stored in the carrier C is received by an indexer robot IR, and is placed on a substrate platform PASS11 by being transported in the same manner as that in the first embodiment.

The substrate W placed on the substrate platform PASS11 is received by the seventh central robot CR7 in the cleaning/drying processing block 15. The seventh central robot CR7 carries the substrate W into the top surface and edge cleaning/drying unit SD in the second cleaning/drying processing group 80b. In the top surface and edge cleaning/drying processing unit SD, the substrate W is subjected to top surface and edge cleaning processing, as in the first embodiment. This causes the top surface and an edge of the substrate W before exposure processing by an exposure device 17 to be kept clean. Thereafter, the seventh central robot CR7 takes out the substrate W that has been subjected to the top surface and edge cleaning processing from the top surface and edge cleaning/drying unit SD, and carries the substrate W into the reversing unit RT in the substrate reversing group 150a.

The reversing unit RT reverses one surface and the other surface of the substrate W, as described above. That is, the reversing unit RT reverses the substrate W whose top surface is directed upward such that the back surface thereof is directed upward. Subsequently, the seventh central robot CR7 takes out the substrate W whose back surface is directed upward from the reversing unit RT, and carries the substrate W into the back surface cleaning unit SDR in the first cleaning/drying processing group 80a. The back surface cleaning unit SDR cleans the back surface of the substrate W, as described above.

Then, the seventh central robot CR7 takes out the substrate W whose back surface has been cleaned from the back surface cleaning unit SDR, and carries the substrate W into the reversing unit RT in the substrate reversing group 150a. Therefore, the reversing unit RT reverses the substrate W whose back surface is directed upward such that the top surface thereof is directed upward. The seventh central robot CR7 takes out the substrate W whose top surface is directed upward from the reversing unit RT, and places the substrate W on the substrate platform PASS13. The substrate W placed on the substrate platform PASS13 is transported to the exposure device 17 in the same manner as that in the first embodiment. Thus, the exposure device 17 subjects the substrate W to exposure processing. The substrate W after the exposure processing is carried into the indexer block 9 and stored in the carrier C in the same manner as that in the first embodiment.

(3) As to the Back Surface Cleaning Unit

The back surface cleaning unit SDR will be herein described in detail with reference to the drawings. Note that the operation of each of constituent elements in the back surface cleaning unit SDR, described below, is controlled by the main controller (controller) 91 shown in FIG. 12.

(3-a) Configuration of Back Surface Cleaning Unit

Figure 15:
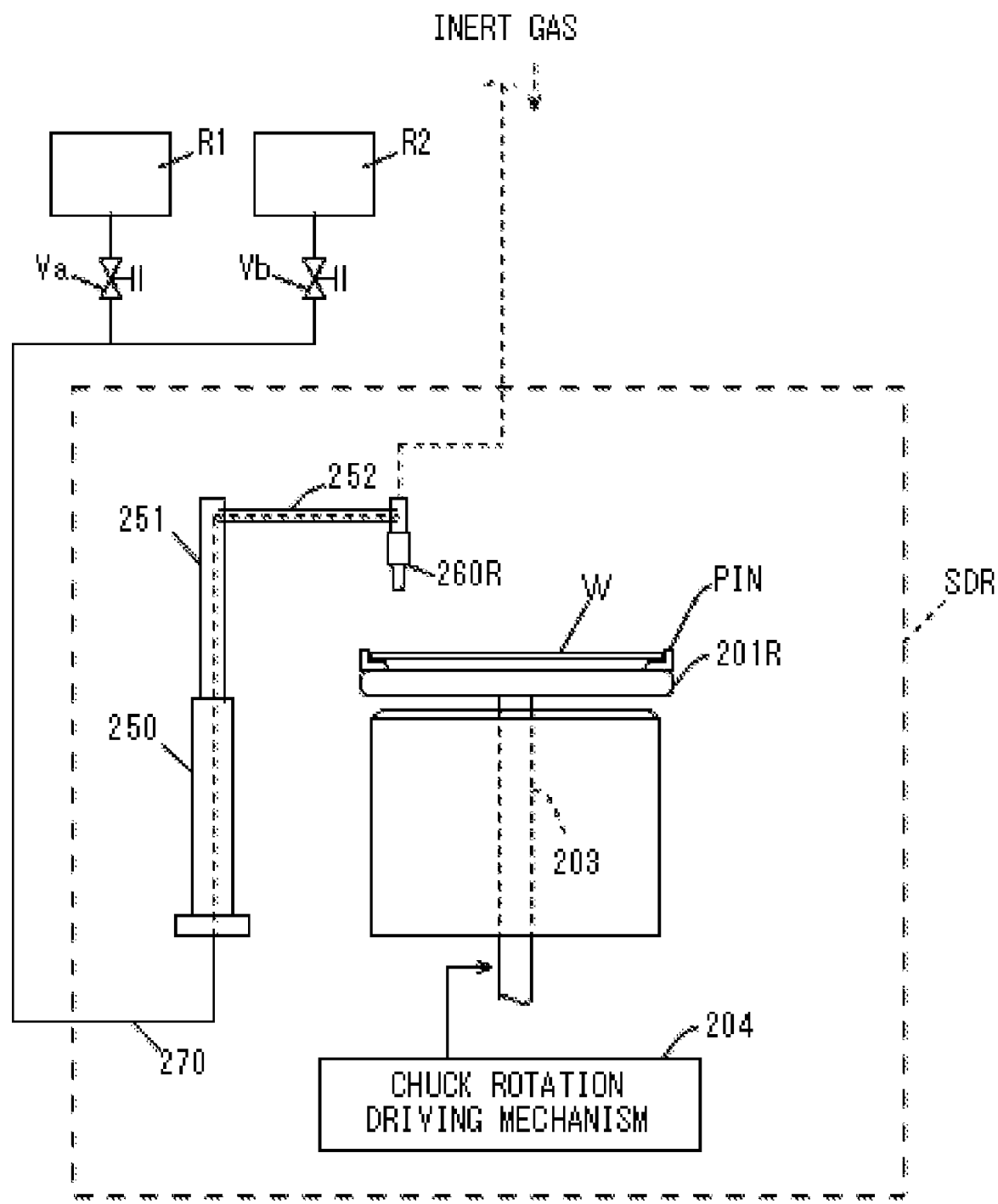
FIG. 15 is a diagram for explaining the configuration of a back surface cleaning unit.

FIG. 15 is a diagram for explaining the configuration of the back surface cleaning unit SDR. The back surface cleaning unit SDR cleans a back surface of a substrate W (back surface cleaning processing). As shown in FIG. 15, the back surface cleaning unit SDR includes a mechanical spin chuck 201R for rotating the substrate W about a vertical axis passing through the center of the substrate W while horizontally holding the substrate W. The spin chuck 201R holds an outer peripheral portion of the substrate W. The spin chuck 201R is secured to an upper end of a rotation shaft 203 that is rotated by a chuck rotation driving mechanism 204.

As described in the foregoing, the substrate W is carried into the back surface cleaning unit SDR with the back surface thereof directed upward. Therefore, the substrate W is held by the spin chuck 201R with the back surface thereof directed upward. At the time of the back surface cleaning processing, the substrate W is rotated while maintaining a horizontal attitude with a peripheral portion on its lower surface and the outer peripheral portion held by a spin holding pin PIN on the spin chuck 201R.

A motor 250 is provided outside the spin chuck 201R, as in the top surface and edge cleaning/drying unit SD. A rotation shaft 251 is connected to the motor 250. An arm 252 is connected to the rotation shaft 251 so as to extend in the horizontal direction, and its tip is provided with a back surface cleaning nozzle 260R. The motor 250 causes the rotation shaft 251 to rotate while causing the arm 252 to swing. This allows the back surface cleaning nozzle 260R to move between an upper position and an outer position of the substrate W held by the spin chuck 201R. A supply pipe 270 for cleaning processing is provided so as to pass through the motor 250, the rotation shaft 251, and the arm 252. The supply pipe 270 is connected to a cleaning liquid supply source R1 and a rinse liquid supply source R2 through a valve Va and a valve Vb, respectively, as in the top surface and edge cleaning/drying unit SD. By controlling the opening and closing of the valves Va and Vb, it is possible to supply a cleaning liquid or a rinse liquid to the back surface of the substrate W through the supply pipe 270 and the back surface cleaning nozzle 260R. This allows the back surface of the substrate W to be cleaned.

(3-b) Operations of Back Surface Cleaning Unit

When the substrate W is carried into the back surface cleaning unit SD, the seventh central robot CR7 shown in FIG. 12 places the substrate W on the spin chuck 201R. The substrate W placed on the spin chuck 201R is held by the spin chuck 201R. The back surface cleaning nozzle 260 then moves to above the center of the substrate W. The rotation shaft 203 rotates so that the substrate W rotates. In this state, the cleaning liquid is discharged to the back surface of the substrate W from the back surface cleaning nozzle 260R. This causes the back surface of the substrate W to be cleaned.

After an elapse of a predetermined time period, the back surface cleaning nozzle 260R discharges the rinse liquid to the back surface of the substrate W in place of the cleaning liquid. This causes the cleaning liquid supplied onto the substrate W to be cleaned away. Furthermore, after an elapse of a predetermined time period, the back surface cleaning nozzle 260R moves outward apart from the substrate W held by the spin chuck 201R after stopping to discharge the rinse liquid to the substrate W.

The number of revolutions of the rotation shaft 203 increases. This causes a great centrifugal force to act on the rinse liquid remaining on the substrate W. Thus, a liquid that adheres to the back surface and the edge of the substrate W is scattered, so that the substrate W is dried. In the back surface cleaning unit SDR, the cleaning liquid and the rinse liquid may be also supplied onto the substrate W by means of a soft spray method using a two-fluid nozzle that discharges a fluid mixture of a gas and a liquid. When the two-fluid nozzle is used, inert gas such as nitrogen gas ($N_2$), argon gas, or helium gas must be supplied, as indicated by a dotted line in FIG. 15, to the back surface cleaning nozzle 260R.

(4) As to the Reversing Unit

The reversing unit RT will be herein described in detail with reference to the drawings. Note that the operation of each of constituent elements in the reversing unit RT, described below, is controlled by the main controller (controller) 91 shown in FIG. 12.

(4-a) Configuration of Reversing Unit

Figure 16:
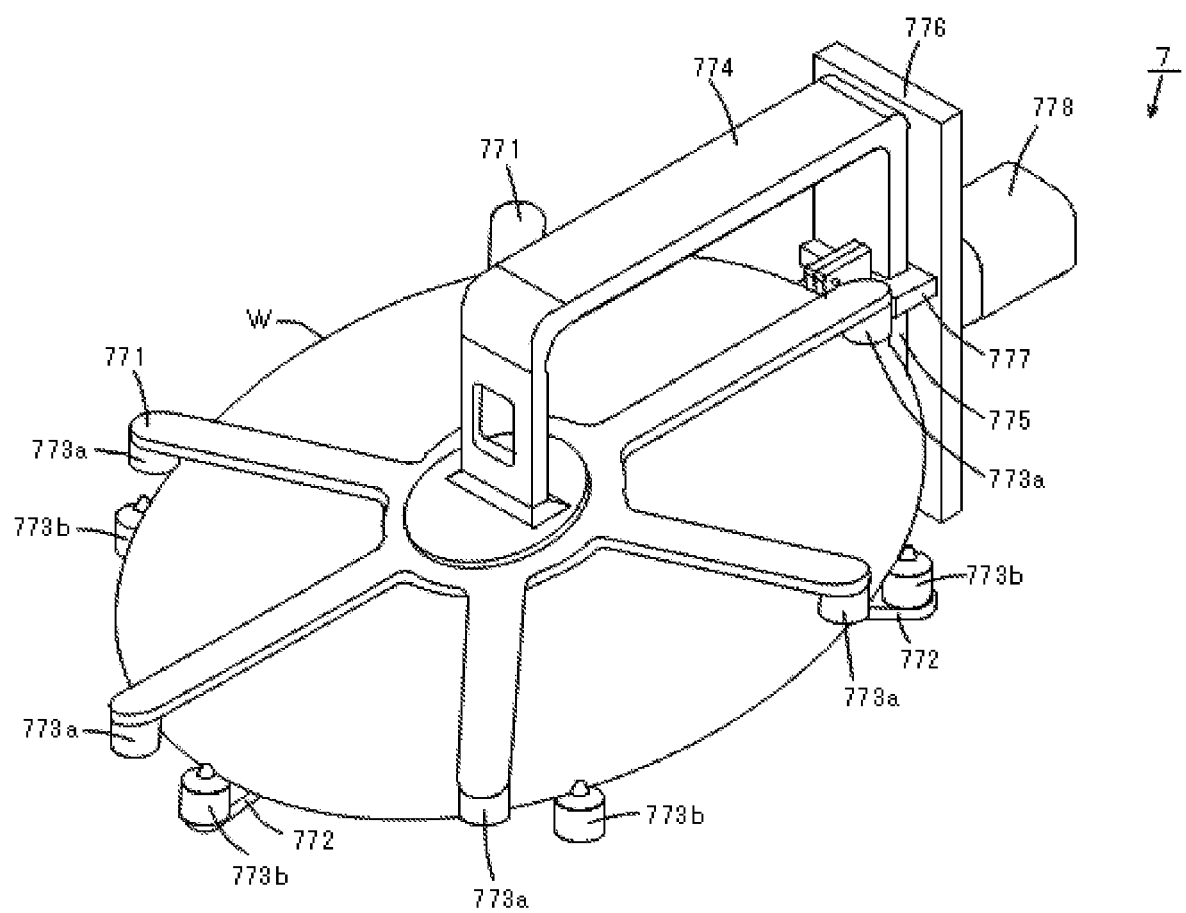
FIG. 16 is a perspective view showing the appearance of a substrate reversing device provided in a reversing unit.
Figure 17:
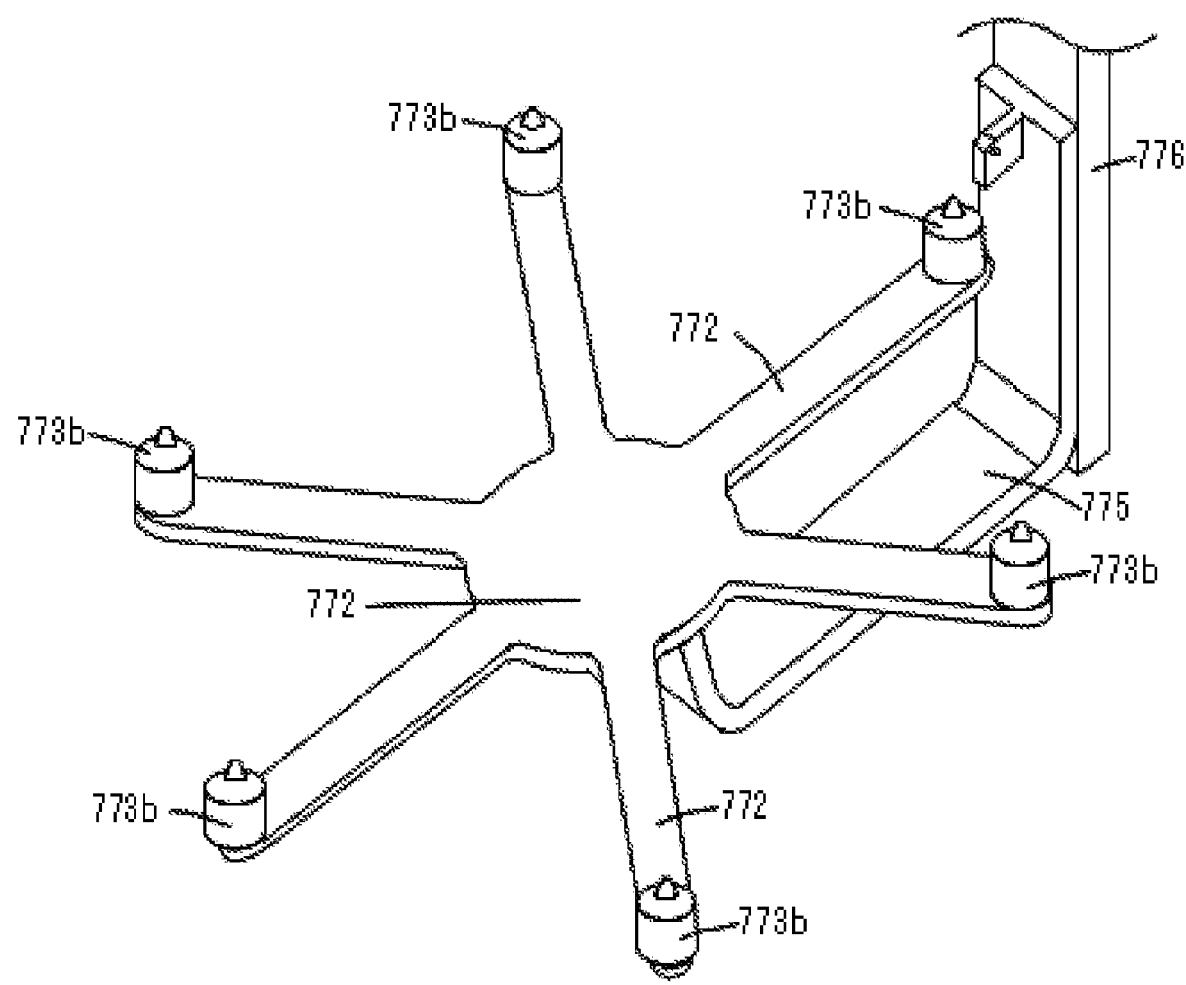
FIG. 17 is a perspective view showing the appearance of a part of the substrate reversing device.

FIG. 16 is a perspective view showing the appearance of a substrate reversing device 7 provided in the reversing unit RT, and FIG. 17 is a perspective view showing the appearance of a part of the substrate reversing device 7. As shown in FIGS. 16 and 17, the substrate reversing device 7 includes a first supporting member 771, a second supporting member 772, a plurality of substrate support pins 773a and 773b, a first movable member 774, a second movable member 775, a fixed plate 776, a rink mechanism 777, and a rotating mechanism 778.

As shown in FIG. 17, the second supporting member 772 is composed of six stick-shaped members radially extending. Each of the six stick-shaped members has the substrate support pin 773b provided at its tip. Similarly, as shown in FIG. 16, the first supporting member 771 is also composed of six stick-shaped members radially extending. Each of the six stick-shaped members has the substrate support pin 773a provided at its tip.

Although in the present embodiment, each of the first and second supporting members 771 and 772 is composed of six stick-shaped members, the present invention is not limited to the same. Each of the first and second supporting members 771 and 772 may be composed of stick-shaped members in any other number or members in any other shape. For example, the first and second supporting members 771 and 772 may be respectively formed in other shapes such as disk shapes or polygonal shapes having outer peripheries along the plurality of first and second substrate support pins 773a and 773b. The first movable member 774 has a U shape. The first supporting member 771 is fixed to one end of the first movable member 774. The other end of the first movable member 774 is connected to the link mechanism 777. Similarly, the second movable member 775 has a U shape. The second supporting member 772 is fixed to one end of the second movable member 775. The other end of the second movable member 775 is connected to the link mechanism 777. The link mechanism 777 is attached to a rotation axis of the rotating mechanism 778. The link mechanism 777 and the rotating mechanism 778 are attached to the fixed plate 776.

The link mechanism 777 shown in FIG. 16 contains an air cylinder or the like, which allows the first movable member 774 and the second movable member 775 to move to a relatively spaced state and a closely-spaced state. Furthermore, the rotating mechanism 778 shown in FIG. 16 contains a motor or the like, which allows the first movable member 774 and the second movable member 775 to rotate through an angle of 180 degrees, for example, about a horizontal axis through the link mechanism 777.

(4-b) Operations of the Reversing Unit

Figure 18:
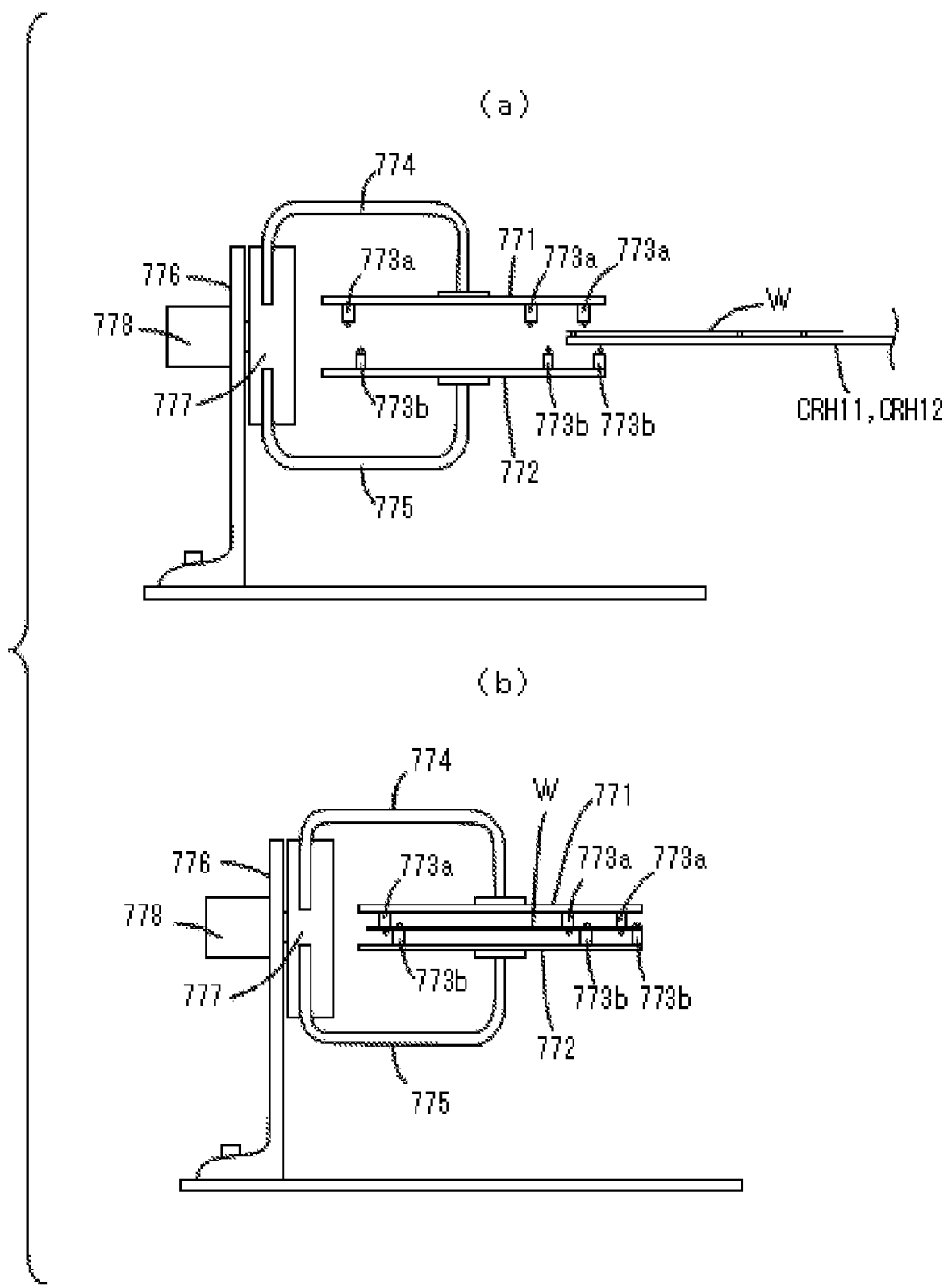
FIG. 18 is a schematic view showing the operations of the substrate reversing device shown in FIG. 16.
Figure 19:
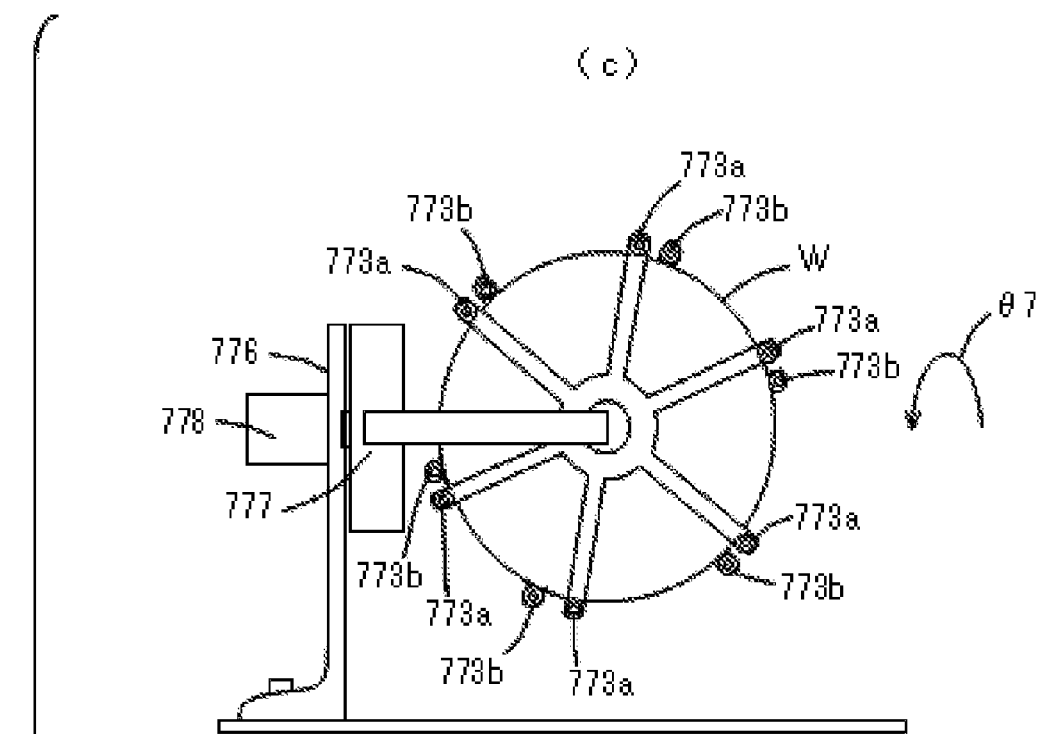
FIG. 19 is a schematic view showing the operations of the substrate reversing device shown in FIG. 16.
Figure 19:
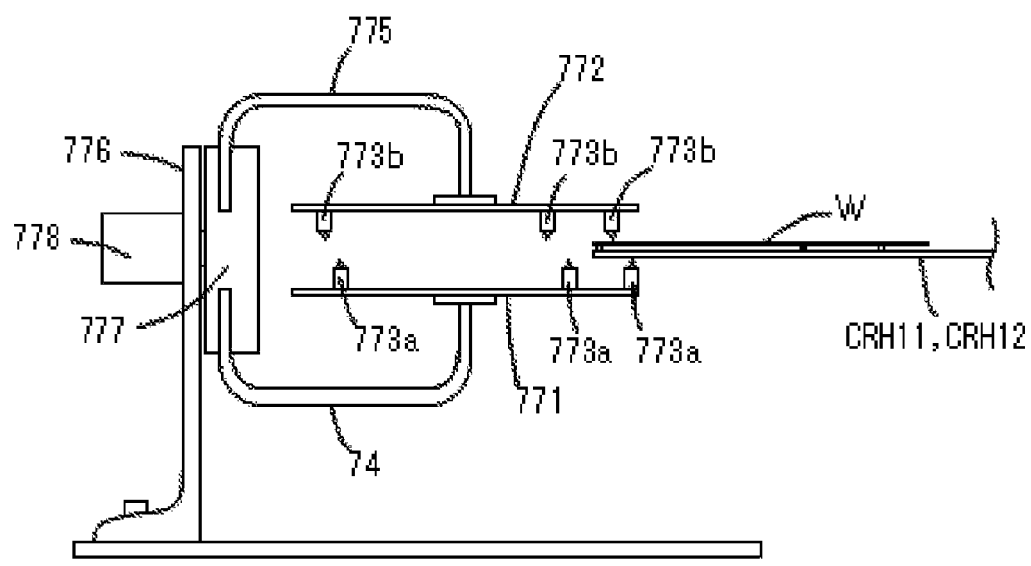

FIGS. 18 and 19 are schematic views showing the operations of the substrate reversing device 7 shown in FIG. 16. First, as shown in FIG. 18(a), the seventh central robot CR7 shown in FIG. 12 carries the substrate W into the substrate reversing device 7. In this case, the action of the link mechanism 777 causes the first movable member 774 and the second movable member 775 to be held in a vertically spaced state.

The hands CRH1 and CRH12 of the seventh central robot CR7 transfer the substrate W onto the plurality of substrate support pins 773 in the second supporting member 772. After the substrate W is transferred, the hands CRH11 and CRH12 of the seventh central robot CR7 exit from the substrate reversing device 7. Then, as shown in FIG. 18 (b), the action of the link mechanism 777 causes the first movable member 774 and the second movable member 775 to move to a vertically closely-spaced state.

Subsequently, as shown in FIG. 19 (c), the action of the rotating mechanism 778 causes the first movable member 774 and the second movable member 775 to rotate through an angle of 180 degrees in a direction indicated by an arrow θ7 about a horizontal axis. In this case, the substrate W, together with the first movable member 774 and the second movable member 775, rotates through an angle of 180 degrees while being held by the plurality of substrate support pins 773a and 773b respectively provided in the first supporting member 771 and the second supporting member 772. Finally, the action of the link mechanism 777 causes the first movable member 774 and the second movable member 775 to move to a vertically spaced state. The hands CRH11 and CRH12 of the seventh central robot CR7 enter the substrate reversing device 7, and exit therefrom with the substrate W held, as shown in FIG. 19 (d).

(5) Effects of Third Embodiment

In the substrate processing apparatus 500 according to the third embodiment, the substrate W before the exposure processing is subjected to the top surface and edge cleaning processing by the top surface and edge cleaning/drying unit SD in the second cleaning/drying processing group 80b, and is subjected to the back surface cleaning processing by the back surface cleaning unit SDR in the first cleaning/drying processing group 80a. Thus, the top surface, the back surface, and the edge of the substrate W before the exposure processing by the exposure device 17 are cleaned. This causes the top surface, the back surface, and the edge of the substrate W carried into the exposure device 17 to be kept clean. As a result, contamination in the exposure device 17 due to contamination on the top surface, the back surface, and the edge of the substrate W before the exposure processing can be further sufficiently prevented, which can more sufficiently prevent a defective dimension and a defective shape of an exposure pattern.

Although the back surface of the substrate W is held by suction on the spin chuck 201 (FIG. 4) during the top surface and edge cleaning processing, the back surface cleaning processing is quickly performed after the top surface and edge cleaning processing. Therefore, suction marks on the back surface of the substrate W are easily removed.

<4> Fourth Embodiment

The difference between a substrate processing apparatus according to a fourth embodiment of the present invention and the substrate processing apparatus 500 according to the first embodiment will be now described.

(1) Configuration of Substrate Processing Apparatus

Figure 20:
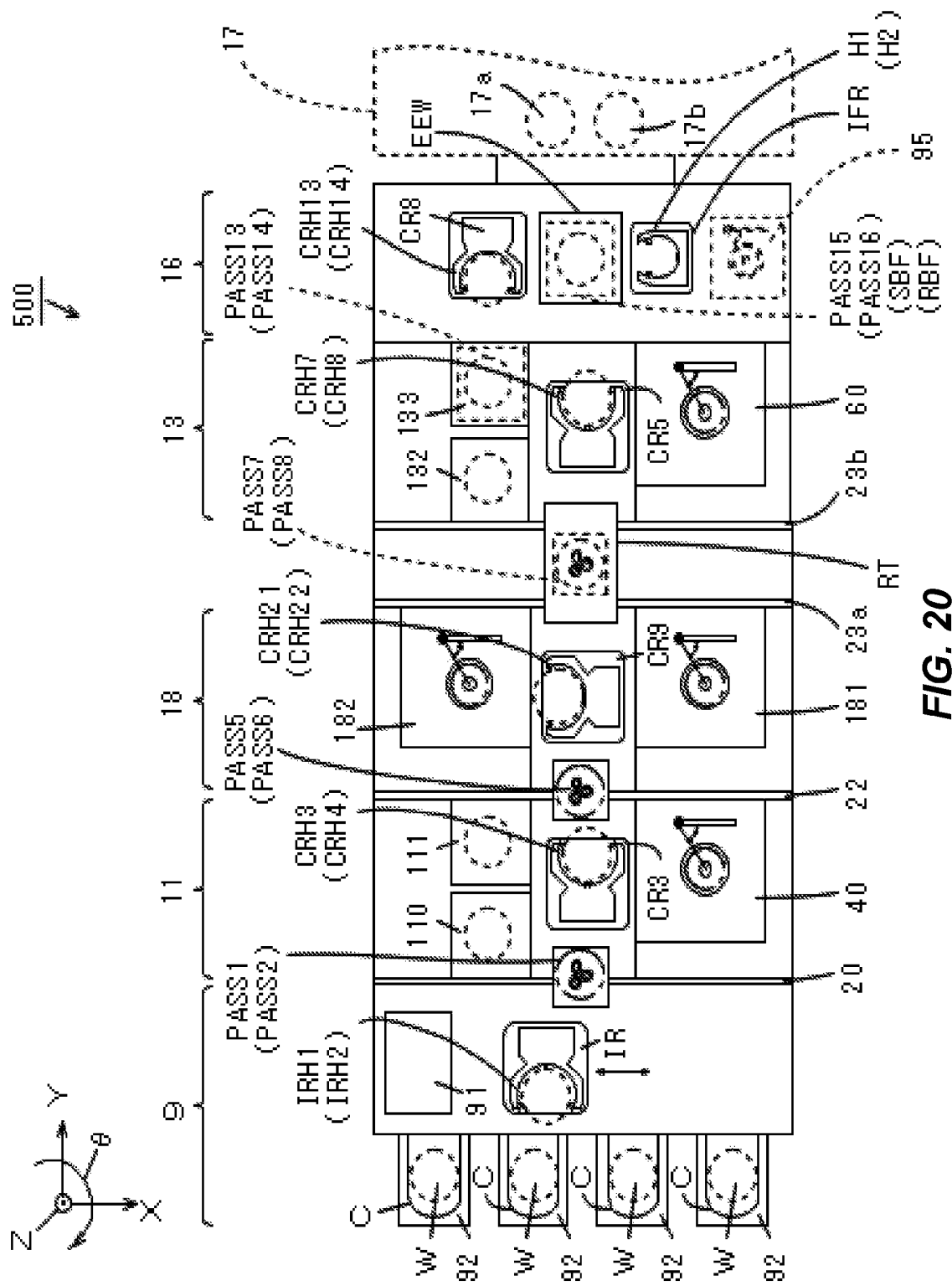
FIG. 20 is a plan view of a substrate processing apparatus according to a fourth embodiment.
Figure 21:
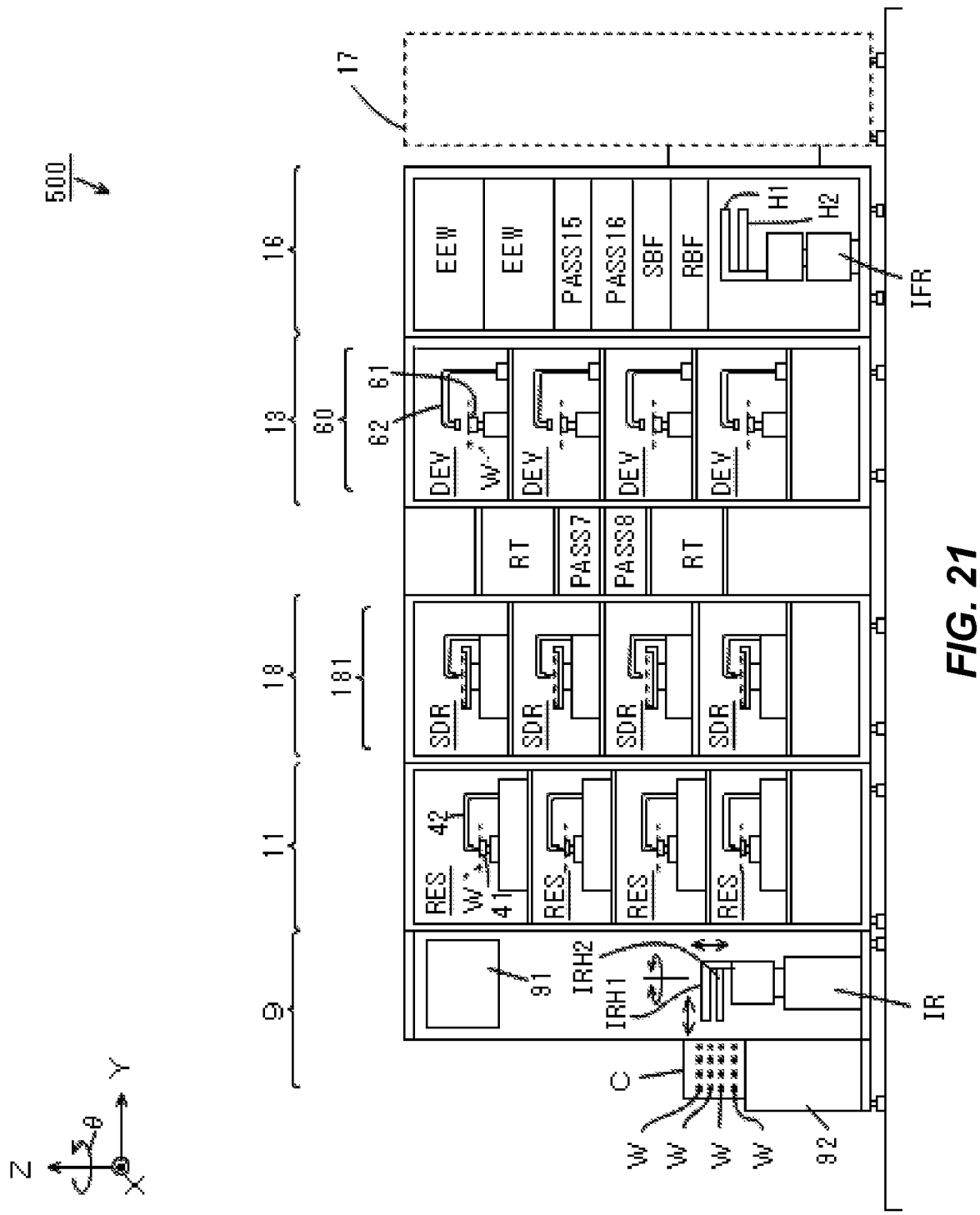
FIG. 21 is a side view on one side of the substrate processing apparatus shown in FIG. 20.
Figure 22:
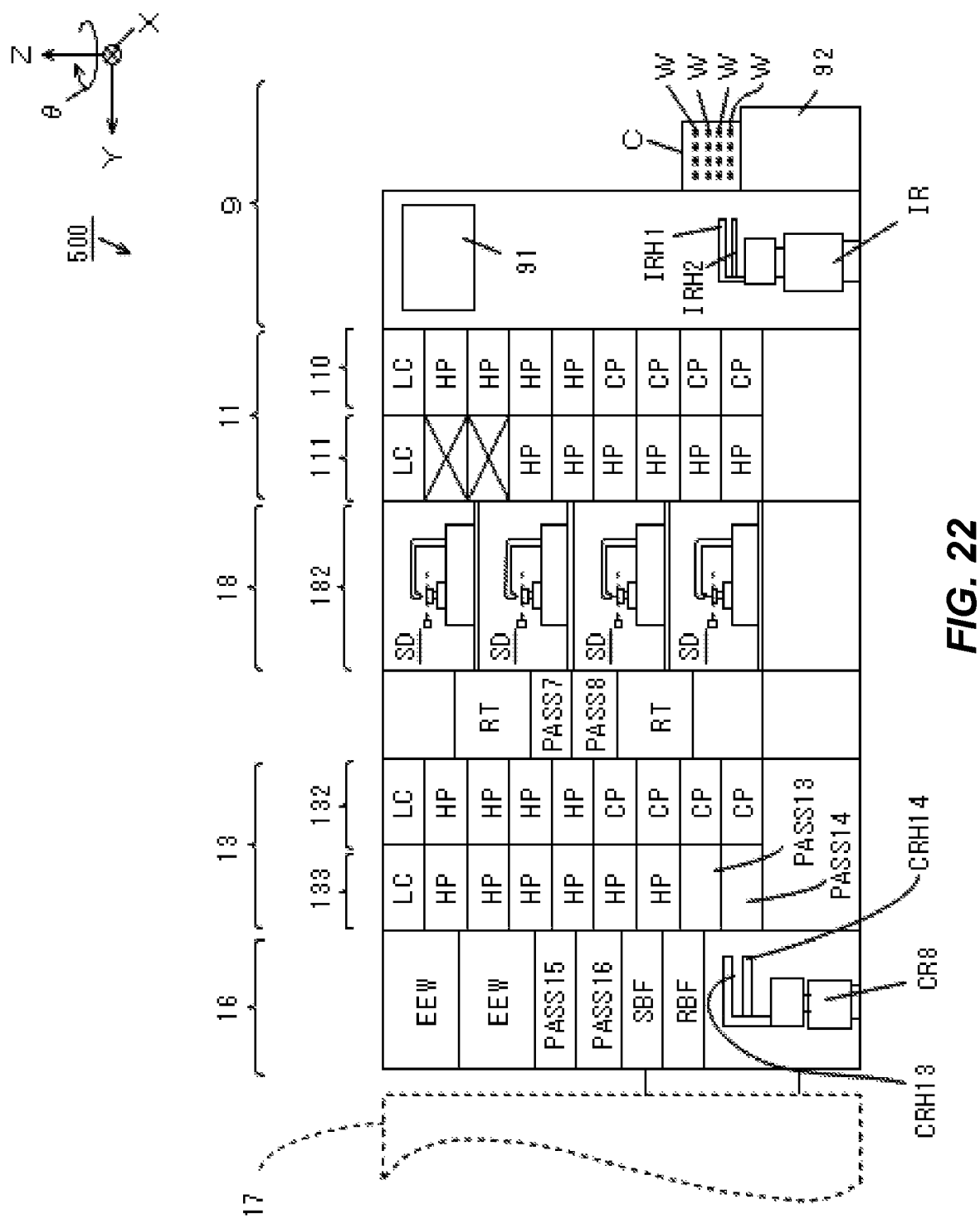
FIG. 22 is a side view on the other side of the substrate processing apparatus shown in FIG. 20.

FIG. 20 is a plan view of a substrate processing apparatus 500 according to a fourth embodiment, FIG. 21 is a side view on one side of the substrate processing apparatus 500 shown in FIG. 20, and FIG. 22 is a side view on the other side of the substrate processing apparatus 500 shown in FIG. 20. The substrate processing apparatus 500 according to the present embodiment is not provided with the anti-reflection film processing block 10, the resist cover film processing block 12, the resist cover film removal block 14, and the cleaning/drying processing block 15 shown in FIG. 1.

The substrate processing apparatus 500 includes an indexer block 9, a resist film processing block 11, a cleaning/drying processing block 18, a development processing block 13, and an interface block 16. In the substrate processing apparatus 500, the blocks 9, 11, 18, 13, and 16 are provided side by side in the foregoing order. The configurations of the indexer block 9 and the resist film processing block 11 are substantially the same as the configurations of the indexer block 9 and the resist film processing block 11 in the first embodiment, respectively. Note that in the resist film processing block 11 in the present embodiment, a coating processing group 40 for resist film has a vertical stack of four coating units RES (see FIG. 21).

As shown in FIG. 20, the cleaning/drying processing block 18 includes a first cleaning/drying processing group 181, a second cleaning/drying processing group 182, and a ninth central robot CR9. The first cleaning/drying processing group 181 is provided opposite to the second cleaning/drying processing group 182 with the ninth central robot CR9 interposed therebetween. The ninth central robot CR9 has hands CRH2 and CRH22 provided one above the other for receiving and transferring substrates W.

As shown in FIGS. 21 and 22, the first cleaning/drying processing group 181 has a vertical stack of four back surface cleaning units SDR, and the second cleaning/drying processing group 182 has a vertical stack of four top surface and edge cleaning/drying units SD. The configuration of the top surface and edge cleaning/drying unit SD is the same as the configuration of the top surface and edge cleaning/drying unit SD shown in FIG. 4 used in the first embodiment, and the configuration of the back surface cleaning unit SDR is the same as the configuration of the back surface cleaning unit SDR shown in FIG. 15 used in the third embodiment.

Returning to FIG. 20, a partition wall 22 is provided between the resist film processing block 11 and the cleaning/drying processing block 18 for shielding an atmosphere. The partition wall 22 has substrate platforms PASS5 and PASS6 provided in close proximity one above the other for receiving and transferring the substrates W between the resist film processing block 11 and the cleaning/drying processing block 18.

The upper substrate platform PASS5 is used in transferring the substrates W from the resist film processing block 11 to the cleaning/drying processing block 18, and the lower substrate platform PASS6 is used in transferring the substrates W from the cleaning/drying processing block 18 to the resist film processing block 11. The development processing block 13 includes a development processing group 60, thermal processing groups 132 and 133, and a fifth central robot CR5. The development processing group 60 is provided opposite to the thermal processing groups 132 and 133 with the fifth central robot CR5 interposed therebetween. Two partition walls 23*a* and 23*b* are provided between the cleaning/drying processing block 18 and the development processing block 13 for shielding an atmosphere. Each of the partition walls 23*a* and 23*b* has substrate platforms PASS7 and PASS18 provided in close proximity one above the other for receiving and transferring the substrates W between the development processing block 13 and the cleaning/drying processing block 18.

The upper substrate platform PASS7 is used in transferring the substrates W from the cleaning/drying processing block 18 to the development processing block 13, and the lower substrate platform PASS8 is used in transferring the substrates W from the development processing block 13 to the cleaning/drying processing block 18. Furthermore, reversing units RT are respectively stacked above the substrate platform PASS7 and below the substrate platform PASS8. The configuration of the two reversing units RT is the same as that of the reversing units RT described in the third embodiment.

As shown in FIGS. 21 and 22, the development processing group 60 has a vertical stack of four development processing units DEV. The thermal processing group 132 has a vertical stack of four heating units HP and four cooling units CP, and the thermal processing group 133 has a vertical stack of six heating units HP and substrate platforms PASS13 and PASS14. Furthermore, each of the thermal processing groups 132 and 133 has a local controller LC for controlling the respective temperatures of the heating unit HP and the cooling unit CP arranged in its uppermost part. The configuration of the interface block 16 is the same as the configuration of the interface block 16 in the first embodiment except that the post-exposure cleaning/drying processing group 95 is not provided. As indicated by a dotted line in FIG. 20, the interface block 16 may be provided with a post-exposure cleaning/drying processing group 95, as in the first embodiment.

(2) Operations of Substrate Processing Apparatus (2-a) First Example of Operations By the above-mentioned configuration, operations different from those in the first embodiment are performed in the substrate processing apparatus 500 according to the present embodiment. First, in the fourth embodiment, carriers C are also respectively placed on carrier platforms 92 in the indexer block 9. As in the third embodiment, a plurality of substrates W that are stored in each of the carriers C are held with their top surfaces directed upward. The unprocessed substrate W that is stored in the carrier C is received by an indexer robot IR, and is placed on the substrate platform PASS5 by being transported in the same manner as that in the first embodiment.

The substrate W placed on the substrate platform PASS5 is received by the ninth central robot CR9 in the cleaning/drying processing block 18. The ninth central robot CR9 carries the substrate W into the top surface and edge cleaning/drying unit SD in the second cleaning/drying processing group 182. Thus, the substrate W is subjected to top surface and edge cleaning processing, which causes a top surface and an edge of the substrate W before exposure processing by an exposure device 17 to be kept clean. Thereafter, the ninth central robot CR9 takes out the substrate W that has been subjected to top surface and edge cleaning processing from the top surface and edge cleaning/drying unit SD, and carries the substrate W into the reversing units RT stacked above and below the substrate platforms PASS7 and PASS8. This causes the substrate W whose top surface is directed upward to be reversed such that a back surface thereof is directed upward by the reversing units RT.

Subsequently, the ninth central robot CR9 takes out the substrate W whose back surface is directed upward from the reversing unit RT, and carries the substrate W into the back surface cleaning unit SDR in the first cleaning/drying processing group 181. Thus, the substrate W is subjected to back surface cleaning processing, which causes the back surface of the substrate W before exposure processing by the exposure device 17 to be kept clean.

Then, the ninth central robot CR9 takes out the substrate W whose back surface has been cleaned from the back surface cleaning unit SDR, and carries the substrate W into the reversing unit RT again. This causes the substrate W whose back surface is directed upward is reversed such that the top surface thereof is directed upward by the reversing units RT. The ninth central robot CR9 takes out the substrate W whose top surface is directed upward from the reversing unit RT, and places the substrate W on the substrate platform PASS7.

The substrate W placed on the substrate platform PASS7 is received by the fifth central robot CR5. The fifth central robot CR5 places the substrate W on the substrate platform PASS13 in the thermal processing group 133. The substrate W placed on the substrate platform PASS13 is received by an eighth central robot CR8 in the interface block 16. The substrate W is transported to the exposure device 17 in the same manner as that in the first embodiment. The substrate W after the exposure processing is placed on a substrate platform PASS16 in the same manner as that in the first embodiment except that it is not carried into the post-exposure cleaning/drying processing group 95, and is received by the eighth central robot CR8. The eighth central robot CR8 carries the received substrate W into the thermal processing group 133 in the development processing block 13. In the thermal processing group 133, the substrate W is subjected to post-exposure bake (PEB). Thereafter, the eighth central robot CR8 takes out the substrate W from the thermal processing group 133, and places the substrate W on the substrate platform PASS14. When the interface block 16 is provided with the post-exposure cleaning/drying processing group 95, the post-exposure cleaning/drying processing group 95 subjects the substrate W after the exposure processing to cleaning and drying processing.

The substrate W placed on the substrate platform PASS14 is received by the fifth central robot CR5 in the development processing block 13. The fifth central robot CR5 carries the substrate W into the development processing group 60. Thus, the substrate W is subjected to development processing. Thereafter, the fifth central robot CR5 takes out the substrate W after the development processing from the development processing group 60, and carries the substrate W into the thermal processing group 132.

In the thermal processing group 132, the substrate W after the development processing is subjected to thermal processing. The fifth central robot CR5 takes out the thermally processed substrate W from the thermal processing group 132, and places the substrate W on the substrate platform PASS8. The substrate W placed on the substrate platform PASS8 is transported by the ninth central robot CR9, a third central robot CR3, and the indexer robot IR, and is stored in the carrier C.

(2-b) Second Example of Operations

In the present embodiment, the first and second cleaning/drying processing groups 181 and 182 in the cleaning/drying processing block 18 may further clean the substrate W after exposure processing and after development processing.

In this case, the ninth central robot CR9 in the cleaning/drying processing block 18 transports, when it receives the substrate W after exposure processing and after development processing from the substrate platform PASS8, the substrate W among the first cleaning/drying processing group 181, the second cleaning/drying processing group 182, and the reversing unit RT. This causes the whole surface of the substrate W after the development processing to be cleaned. Thereafter, the ninth central robot CR9 places the substrate W on the substrate platform PASS6.

(3) Effects of Fourth Embodiment

As described in the foregoing, the plurality of top surface and edge cleaning/drying units SD and the plurality of back surface cleaning units SDR are provided so as to be opposite to each other with the ninth central robot CR9 interposed therebetween in the cleaning/drying processing group 18. Furthermore, the two reversing units RT are respectively stacked above and below the substrate platforms PASS7 and PASS8 arranged in the cleaning/drying processing group 18. Thus, in the cleaning/drying processing group 18, the top surface and edge cleaning/drying units SD, the back surface cleaning units SDR, and the reversing unit RT are provided so as to surround the ninth central robot CR9.

Thus, the transport distance of the substrate among the units SD, SDR, and RT becomes shorter, as compared with that in a case where the plurality of blocks are respectively provided with the top surface and edge cleaning/drying units SD, the back surface cleaning units SDR, and the reversing units RT. Therefore, a time period required to transport the substrate W among the units SD, SDR, and RT by the ninth central robot CR9 is shortened. As a result, throughput in substrate processing of the whole substrate processing apparatus can be sufficiently improved.

<5> Fifth Embodiment

The difference between a substrate processing apparatus according to a fifth embodiment of the present invention and the substrate processing apparatus 500 according to the fourth embodiment will be now described.

(1) Configuration of Substrate Processing Apparatus

Figure 23:
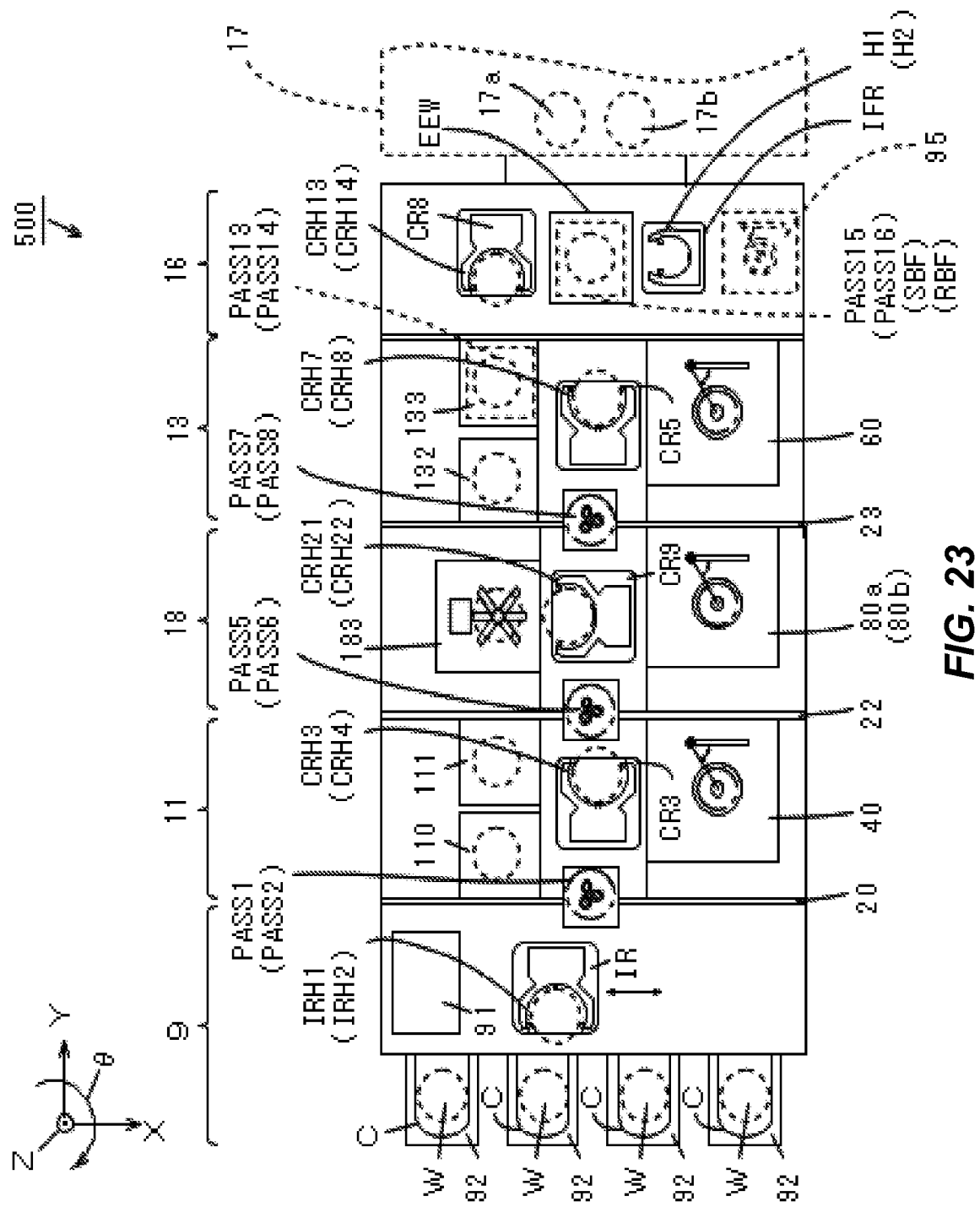
FIG. 23 is a plan view of a substrate processing apparatus according to a fifth embodiment.
Figure 24:
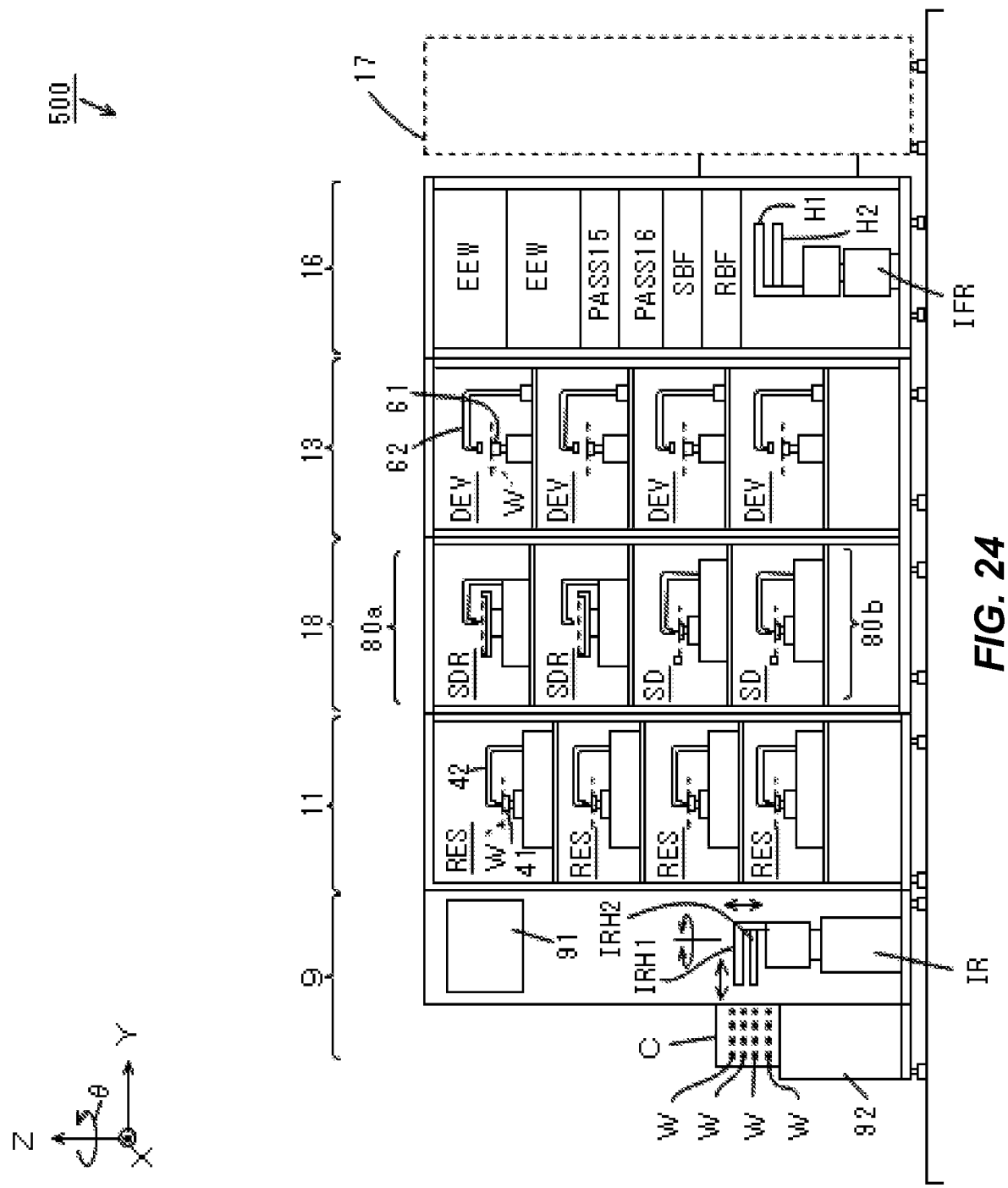
FIG. 24 is a side view on one side of the substrate processing apparatus shown in FIG. 23.
Figure 25:
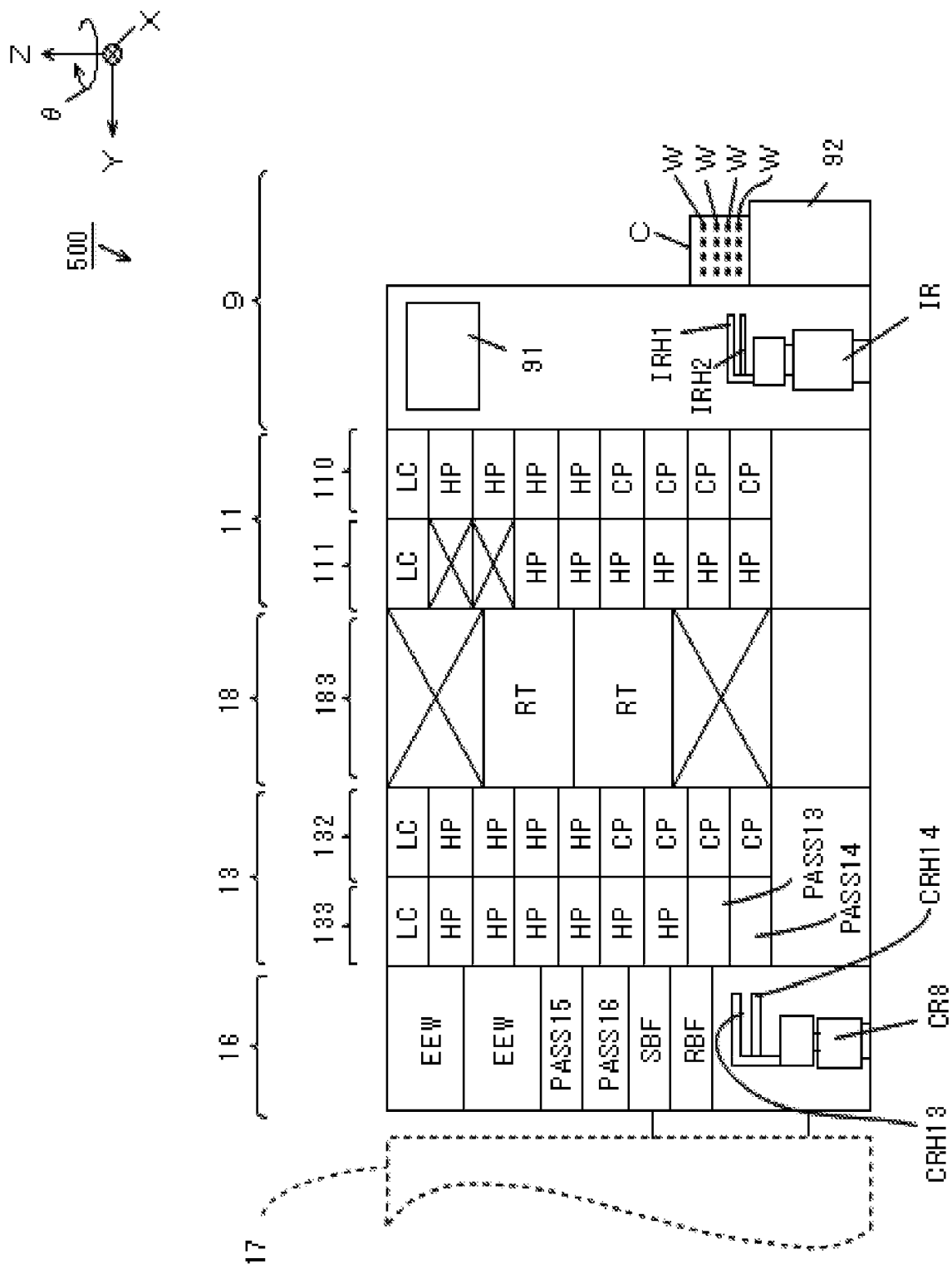
FIG. 25 is a side view on the other side of the substrate processing apparatus shown in FIG. 23.

FIG. 23 is a plan view of a substrate processing apparatus 500 according to a fifth embodiment, FIG. 24 is a side view on one side of the substrate processing apparatus 500 shown in FIG. 23, and FIG. 25 is a side view on the other side of the substrate processing apparatus 500 shown in FIG. 23. In the substrate processing apparatus 500 according to the present embodiment, the configuration of a cleaning/drying processing block 18 differs from the substrate processing apparatus 18 according to the fourth embodiment.

The cleaning/drying processing block 18 includes a substrate reversing group 183, a first cleaning/drying processing group 80*a*, a second cleaning/drying processing group 80*b*, and a ninth central robot CR9. The first cleaning/drying processing group 80*a* and the second cleaning/drying processing group 80*b* are vertically stacked in this order. The first and second cleaning/drying processing groups 80a and 80b are provided opposite to the substrate reversing group 183 with the ninth central robot CR9 interposed therebetween.

As shown in FIG. 24, the first cleaning/drying processing group 80a and the second cleaning/drying processing group 80b are vertically stacked in this order. The first cleaning/drying processing group 80a has a vertical stack of two back surface cleaning units SDR, and the second cleaning/drying processing group 80b has a vertical stack of two top surface and edge cleaning/drying units SD. As shown in FIG. 25, the substrate reversing group 183 has a vertical stack of two reversing units RV.

(2) Operations of Substrate Processing Apparatus

The operations of the substrate processing apparatus 500 according to the fifth embodiment will be described.

In the present embodiment, an unprocessed substrate W that is stored in a carrier C is transported by an indexer robot IR and a third central robot CR3, and is placed on a substrate platform PASS5, as in the fourth embodiment. The substrate W placed on the substrate platform PASS5 is received by the ninth central robot CR9 in the cleaning/drying processing block 18. The ninth central robot CR9 carries the substrate W into the top surface and edge cleaning/drying unit SD in the second cleaning/drying processing group 80b. Thus, the substrate W is subjected to top surface and edge cleaning processing, which causes a top surface and an edge of the substrate W before exposure processing by an exposure device 17 to be kept clean.

Thereafter, the ninth central robot CR9 takes out the substrate W that has been subjected to the top surface and edge cleaning processing from the top surface and edge cleaning/drying unit SD, and carries the substrate W into the reversing unit RT in the substrate reversing group 183. This causes the substrate W whose top surface is directed upward is reversed such that a back surface thereof is directed upward by the reversing unit RT. Subsequently, the ninth central robot CR9 takes out the substrate W whose back surface is directed upward from the reversing unit RT, and carries the substrate W into the back surface cleaning unit SDR in the first cleaning/drying processing group 80a. Thus, the substrate W is subjected to back surface cleaning processing, which causes the back surface of the substrate W before exposure processing by the exposure device 17 to be kept clean.

Then, the ninth central robot CR9 takes out the substrate W whose back surface has been cleaned from the back surface cleaning unit SDR, and carries the substrate W into the reversing unit RT again. This causes the substrate W whose back surface is directed upward to be reversed such that the top surface thereof is directed upward by the reversing unit RT. The ninth central robot CR9 takes out the substrate W whose top surface is directed upward from the reversing unit RT, and places the substrate W on the substrate platform PASS7.

The substrate W placed on the substrate platform PASS7 is transported to the exposure device 17, where the substrate W is subjected to exposure processing, as in the fourth embodiment. Thereafter, the substrate W is transported to the indexer block 9, as in the fourth embodiment.

(3) Effects of Fifth Embodiment

As described in the foregoing, in the substrate processing apparatus 500, the top surface and edge cleaning/drying unit SD and the back surface cleaning unit SDR are arranged opposite to the reversing unit RT with the ninth central robot CR9 interposed therebetween within the cleaning/drying processing block 18.

Thus, the transport distance of the substrate W among the units SD, SDR, and RT is shorter, as compared with that in a case where the top surface and edge cleaning/drying unit SD, the back surface cleaning unit SDR, and the reversing unit RT are provided over a plurality of blocks. Therefore, a time period required to transport the substrate W among the units SD, SDR, and RT by the ninth central robot CR9 is shortened. As a result, throughput in substrate processing of the whole substrate processing apparatus can be sufficiently improved.

<6> Another Embodiment and Effects Thereof (1) As to the Resist Cover Film

In each of the substrate processing apparatuses 500 according to the first to third embodiments, the resist cover film processing block 12 and the resist cover film removal block 14 need not be provided in the substrate processing apparatus 500, provided that a component of a resist is not eluted in a liquid used in the exposure device 17 even if the resist film formed on the top surface of the substrate W and the liquid are brought into contact with each other. In this case, by removing each of the blocks 12 and 14, the miniaturization of the substrate processing apparatus 500 and the reduction of a foot print are realized, and throughput in substrate processing is further improved.

(2) Another Example of Arrangement

Although in the first to third embodiments, the resist cover film removal block 14 includes the two resist cover film removal processing groups 70a and 70b, the resist cover film removal block 14 may include a thermal processing group that subjects the substrate W to thermal processing in place of one of the two resist cover film removal processing groups 70a and 70b. In this case, the plurality of substrates W are efficiently subjected to thermal processing, so that throughput in substrate processing is improved.

(3) As to the Exposure Device

In each of the above-mentioned embodiments, the exposure device 17 may subject the substrate W to the exposure processing without using the liquid immersion method. In this case, the object of the present invention can be also achieved by providing the substrate processing apparatus 500 with a top surface and edge cleaning/drying unit SD.

<7> Correspondences Between Elements in the Claims and Parts in Embodiments

In the following paragraphs, non-limiting examples of correspondences between various elements recited in the claims below and those described above with respect to various preferred embodiments of the present invention are explained.

In the embodiments described above, the anti-reflection film processing block 10, the resist film processing block 11, the resist cover film processing block 12, the development processing block 13, the resist cover film removal block 14, and the cleaning/drying processing blocks 15 and 18 are examples of a processing section, and the interface block 16 is an example of an interface unit. The resist film is an example of a photosensitive film, the coating unit RES is an example of a photosensitive film formation unit, the top surface and edge cleaning/drying unit SD is an example of a top surface and edge cleaning unit, the development processing unit DEV is an example of a development unit, and the coating unit BARC is an example of an anti-reflection film formation unit.

Furthermore, the resist cover film is an example of a protective film, the coating unit COV is an example of a protective film formation unit, the removal unit REM is an example of a protective film removal unit, the third central robot CR3 is an example of a first transport unit, the resist film processing block 11 is an example of a first processing unit, the seventh and ninth central robots CR7 and CR9 are examples of a second transport unit, and the cleaning/drying processing blocks 15 and 18 are examples of a second processing unit.

The fifth central robot CR5 is an example of a third transport unit, the development processing block 13 is an example of a third processing unit, the post-exposure cleaning/drying processing group 95 is an example of a cleaning/drying unit, and the eighth central robot CR8 and the interface transporting mechanism IFR are examples of an interface unit.

As the elements recited in the claims, various other elements having the structure or function recited in the claims may be employed. While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing apparatus that is arranged adjacent to an exposure device, the substrate processing apparatus comprising:
    a processing section that subjects a substrate to processing; and
    an interface provided adjacent to one end of the processing section configured to transfer and receive the substrate between the processing section and the exposure device, wherein the processing section includes:
        a photosensitive film formation unit configured to form a photosensitive film composed of a photosensitive material on the substrate that has not been subjected to exposure processing by the exposure device;
        a top surface and edge cleaning unit configured to clean a top surface and an edge of the substrate; and
        a development unit configured to subject the substrate to development processing after the exposure processing by the exposure device, wherein
    the top surface and edge cleaning unit includes a brush configured to be brought into contact with the edge of the substrate to clean the edge of the substrate.

2. The substrate processing apparatus of claim 1 wherein the top surface and edge cleaning unit is configured to clean the top surface and the edge of the substrate after the formation of the photosensitive film by the photosensitive film formation unit and before the exposure processing by the exposure device.

3. The substrate processing apparatus of claim 1 wherein the top surface and edge cleaning unit is configured to clean the top surface and the edge of the substrate concurrently.

4. The substrate processing apparatus of claim 3 wherein the top surface and edge cleaning unit is configured to clean the top surface and the edge of the substrate simultaneously.

5. The substrate processing apparatus of claim 1 wherein the processing section further includes an anti-reflection film formation unit that is configured to form an anti-reflection film on the substrate before the formation of the photosensitive film by the photosensitive film formation unit.

6. The substrate processing apparatus of claim 1 wherein the processing section further includes a protective film formation unit that is configured to form a protective film for protecting the photosensitive film after the formation of the photosensitive film by the photosensitive film formation unit and before the exposure processing by the exposure device.

7. The substrate processing apparatus of claim 1 wherein the processing section further includes a protective film removal unit that is configured to remove a protective film after the exposure processing by the exposure device and before the development processing by the development unit.

8. The substrate processing apparatus of claim 1 wherein the processing section further includes a reversing unit that is configured to reverse one surface and the other surface of the substrate and a back surface cleaning unit that cleans a back surface of the substrate reversed by the reversing unit.

9. The substrate processing apparatus of claim 1 wherein the processing section further includes:
    a first processing unit comprising the photosensitive film formation unit and a first transport unit that transports the substrate;
    a second processing unit comprising the top surface and edge cleaning unit and a second transport unit that transports the substrate, wherein the second processing unit is arranged adjacent to the interface; and
    a third processing unit comprising the development unit and a third transport unit that transports the substrate.

10. The substrate processing apparatus of claim 1 wherein the interface comprises a cleaning/drying unit that is configured to clean and dry the substrate after the exposure processing by the exposure device and an interface unit that transports the substrate.

* * * * *